US010560652B2

(12) United States Patent
Sano

(10) Patent No.: US 10,560,652 B2
(45) Date of Patent: Feb. 11, 2020

(54) STACKED SOLID-STATE IMAGE SENSOR COMPRISING VERTICAL TRANSISTOR FOR GENERATING A PIXEL SIGNAL, SWITCHING BETWEEN FIRST AND SECOND DRIVING METHODS THEREOF, AND ELECTRONIC APPARATUS

(71) Applicant: SONY CORPORATION, Tokyo (JP)

(72) Inventor: Takuya Sano, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/746,083

(22) PCT Filed: Apr. 7, 2017

(86) PCT No.: PCT/JP2017/014452
§ 371 (c)(1),
(2) Date: Jan. 19, 2018

(87) PCT Pub. No.: WO2017/183477
PCT Pub. Date: Oct. 26, 2017

(65) Prior Publication Data
US 2018/0213174 A1 Jul. 26, 2018

(30) Foreign Application Priority Data

Apr. 22, 2016 (JP) .................................. 2016-086551

(51) Int. Cl.
*H04N 5/378* (2011.01)
*H04N 5/369* (2011.01)
(Continued)

(52) U.S. Cl.
CPC ........... *H04N 5/378* (2013.01); *H01L 27/146* (2013.01); *H01L 31/10* (2013.01); *H01L 31/107* (2013.01);
(Continued)

(58) Field of Classification Search
CPC .. H04N 5/378; H04N 5/3745; H04N 5/37206; H04N 5/37455; H04N 5/379;
(Continued)

(56) References Cited

U.S. PATENT DOCUMENTS 9,324,753 B2 * 4/2016 Kato .................... H01L 27/1461
2010/0270594 A1 * 10/2010 Shimizu ............ H01L 27/14603
257/225
(Continued)

FOREIGN PATENT DOCUMENTS

JP 2008-099174 * 4/2008 ........... H01L 27/148
JP 2010-258340 11/2010
(Continued)

OTHER PUBLICATIONS

International Search Report prepared by the Japan Patent Office dated Apr. 28, 2017, for International Application No. PCT/JP2017/014452.

*Primary Examiner* — Twyler L Haskins
*Assistant Examiner* — Akshay Trehan
(74) *Attorney, Agent, or Firm* — Sheridan Ross P.C.

(57) ABSTRACT

The present disclosure relates to a solid-state image sensor, driving method, and electronic apparatus, capable of achieving reduction in pixel size and sensitivity improvement. The solid-state image sensor includes a PD configured to convert light into electric charge by photoelectric conversion and to store the electric charge, a first transfer transistor configured to read out the electric charge stored in the photoelectric conversion unit, a multiplication region configured to store temporarily and multiply the electric charge read out through the read-out unit, and a second transfer transistor configured to transfer the electric charge stored in the multiplication region to a conversion unit configured to convert the electric charge into a pixel signal. Then, an intense electric field is generated in the multiplication region (Continued)

to multiply electric charge by the avalanche effect in transferring the electric charge from the multiplication region to an FD portion through the second transfer transistor. The present technology is applicable to, in one example, the stacked CMOS image sensors.

16 Claims, 31 Drawing Sheets

(51) Int. Cl.
    *H01L 31/10* (2006.01)
    *H01L 31/107* (2006.01)
    *H01L 27/146* (2006.01)
    *H04N 5/3745* (2011.01)
    *H04N 5/372* (2011.01)

(52) U.S. Cl.
    CPC ......... *H04N 5/379* (2018.08); *H04N 5/37206* (2013.01); *H04N 5/37452* (2013.01); *H04N 5/37455* (2013.01); *H04N 5/37457* (2013.01)

(58) Field of Classification Search
    CPC ............... H04N 5/369; H04N 5/37452; H04N 5/37457; H01L 27/146; H01L 31/10; H01L 27/14634; H01L 27/14636; H01L 27/14638; H01L 31/107; H01L 29/66909; H01L 29/7313; H01L 29/732
    See application file for complete search history.

(56) References Cited

U.S. PATENT DOCUMENTS

| | | | | |
|---|---|---|---|---|
| 2013/0009039 | A1* | 1/2013 | Sato | H01L 27/14623 250/208.1 |
| 2014/0299747 | A1* | 10/2014 | Tachino | H01L 27/14614 250/208.1 |
| 2015/0001376 | A1* | 1/2015 | Miyanami | H01L 27/14643 250/208.1 |
| 2015/0115131 | A1* | 4/2015 | Webster | H01L 27/14603 250/208.1 |
| 2015/0129943 | A1* | 5/2015 | Kato | H01L 27/1461 257/292 |
| 2015/0162368 | A1* | 6/2015 | Egawa | H01L 27/14603 257/432 |
| 2015/0281620 | A1* | 10/2015 | Usuda | H01L 27/14609 250/208.1 |
| 2016/0043120 | A1* | 2/2016 | Ahn | H01L 27/1463 257/229 |
| 2016/0056199 | A1 | 2/2016 | Kim et al. | |
| 2016/0351606 | A1 | 12/2016 | Azami et al. | |

FOREIGN PATENT DOCUMENTS

| | | | | |
|---|---|---|---|---|
| JP | 2013-016676 | | 1/2013 | |
| JP | 2013-179275 | | 9/2013 | |
| JP | 2015-012241 | | 1/2015 | |
| JP | 2015-095468 | | 5/2015 | |
| JP | 2015-115345 | | 6/2015 | |
| JP | 2015-153962 | | 8/2015 | |
| JP | WO2016/017305 | * | 2/2016 | ............ H04N 5/374 |
| WO | WO 2016/017305 | | 2/2016 | |

* cited by examiner though its pixel structure and circuit configuration are completely novel, unlike CMOS image sensors in related art. For this reason, such a multiplication sensor is difficult to apply to the CMOS image sensors in related art because the compatibility of the techniques is low. In addition, researches on CMOS sensors having a multiplication region called electron multiplier CMOS (EMCMOS) have been recently performed, but the necessity to additionally provide a multiplication region makes achievement of reduction in pixel size difficult.

STACKED SOLID-STATE IMAGE SENSOR COMPRISING VERTICAL TRANSISTOR FOR GENERATING A PIXEL SIGNAL, SWITCHING BETWEEN FIRST AND SECOND DRIVING METHODS THEREOF, AND ELECTRONIC APPARATUS

CROSS REFERENCE TO RELATED APPLICATIONS

This application is a national stage application under 35 U.S.C. 371 and claims the benefit of PCT Application No. PCT/JP2017/014452 having an international filing date of 7 Apr. 2017, which designated the United States, which PCT application claimed the benefit of Japan Patent Application No. 2016-086551 filed 22 Apr. 2016, the disclosures of each of which are incorporated herein by reference in their entirety.

TECHNICAL FIELD

The present disclosure relates to a solid-state image sensor, a driving method, and an electronic apparatus, and in particular, to a solid-state image sensor, driving method, and electronic apparatus, capable of achieving reduction in pixel size and sensitivity improvement.

BACKGROUND ART

In the related art, in an electronic apparatus, such as digital still cameras or digital video cameras, equipped with an image capture function, in one example, a solid-state image sensor such as charge-coupled device (CCD) or complementary metal-oxide-semiconductor (CMOS) image sensor has been used. The solid-state image sensor has a pixel in which a photodiode (PD) that performs photoelectric conversion and a plurality of transistors are combined, and an image is constructed on the basis of pixel signals that are output from a plurality of pixels arranged on an image plane on which an image of a photographic subject is formed.

Further, as the size of a pixel become smaller, there has been concern that a region enough to install a PD is very difficult to be prepared and the signal-to-noise (SN) ratio is decreased, and so techniques for increasing the volume of a PD have been developed.

In one example, a technique capable of preventing the decrease in saturated electric charge amount, sensitivity, or the like and of improving random noise, random telegraph signal (RTS) noise, or the like by separating a PD and a transistor in the depth direction has been developed (e.g., refer to Patent Literature 1).

Further, an imaging device including a multiplier sensor for multiplying electrons due to impact ionization by an electric field in order to further improve the sensitivity has been developed (e.g., refer to Patent Literature 2).

CITATION LIST

Patent Literature

Patent Literature 1: JP 2014-199898A
Patent Literature 2: JP 2007-235097A

DISCLOSURE OF INVENTION

Technical Problem

Meanwhile, as a silicon-based multiplication sensor, an avalanche photodiode (APD), single-photon avalanche diode (SPAD), or the like is widely used, but its pixel structure and circuit configuration are completely novel, unlike CMOS image sensors in related art. For this reason, such a multiplication sensor is difficult to apply to the CMOS image sensors in related art because the compatibility of the techniques is low. In addition, researches on CMOS sensors having a multiplication region called electron multiplier CMOS (EMCMOS) have been recently performed, but the necessity to additionally provide a multiplication region makes achievement of reduction in pixel size difficult.

The present disclosure is made in view of such a situation, and is intended to make it possible to achieve reduction in pixel size and sensitivity improvement.

Solution to Problem

According to an aspect of the present disclosure, a solid-state image sensor includes: a photoelectric conversion unit configured to convert light into electric charge by photoelectric conversion and to store the electric charge; a read-out unit configured to read out the electric charge stored in the photoelectric conversion unit; a multiplication region configured to store temporarily and multiply the electric charge read out through the read-out unit; and a transfer unit configured to transfer the electric charge stored in the multiplication region to a conversion unit configured to convert the electric charge into a pixel signal.

According to an aspect of the present disclosure, there is provided a method of driving a solid-state image sensor including a photoelectric conversion unit configured to convert light into electric charge by photoelectric conversion and to store the electric charge; a read-out unit configured to read out the electric charge stored in the photoelectric conversion unit, a multiplication region configured to store temporarily and multiply the electric charge read out through the read-out unit, and a transfer unit configured to transfer the electric charge stored in the multiplication region to a conversion unit configured to convert the electric charge into a pixel signal, the method including a step of generating an intense electric field region in the multiplication region to multiply electric charge by an avalanche effect in transferring the electric charge from the multiplication region to the conversion unit through the transfer unit.

According to an aspect of the present disclosure, an electronic apparatus includes a solid-state image sensor including a photoelectric conversion unit configured to convert light into electric charge by photoelectric conversion and to store the electric charge, a read-out unit configured to read out the electric charge stored in the photoelectric conversion unit, a multiplication region configured to store temporarily and multiply the electric charge read out through the read-out unit, and a transfer unit configured to transfer the electric charge stored in the multiplication region to a conversion unit configured to convert the electric charge into a pixel signal.

According to an embodiment of the present disclosure, the photoelectric conversion unit allows electric charge converted from light by photoelectric conversion to be stored, the read-out unit allows the electric charge stored in the photoelectric conversion unit to be read out, the multiplication region allows the electric charge read out through the read-out unit to be stored temporarily and multiplied, and the transfer unit allows the electric charge stored in the multiplication region to be transferred to the conversion unit configured to convert electric charge into a pixel signal.

Advantageous Effects of Invention

According to an embodiment of the present disclosure, it is possible to achieve reduction in pixel size and sensitivity improvement.

MODE(S) FOR CARRYING OUT THE INVENTION

A specific embodiment to which the present technology is applied is now described in detail with reference to the drawings.

Figure 1:
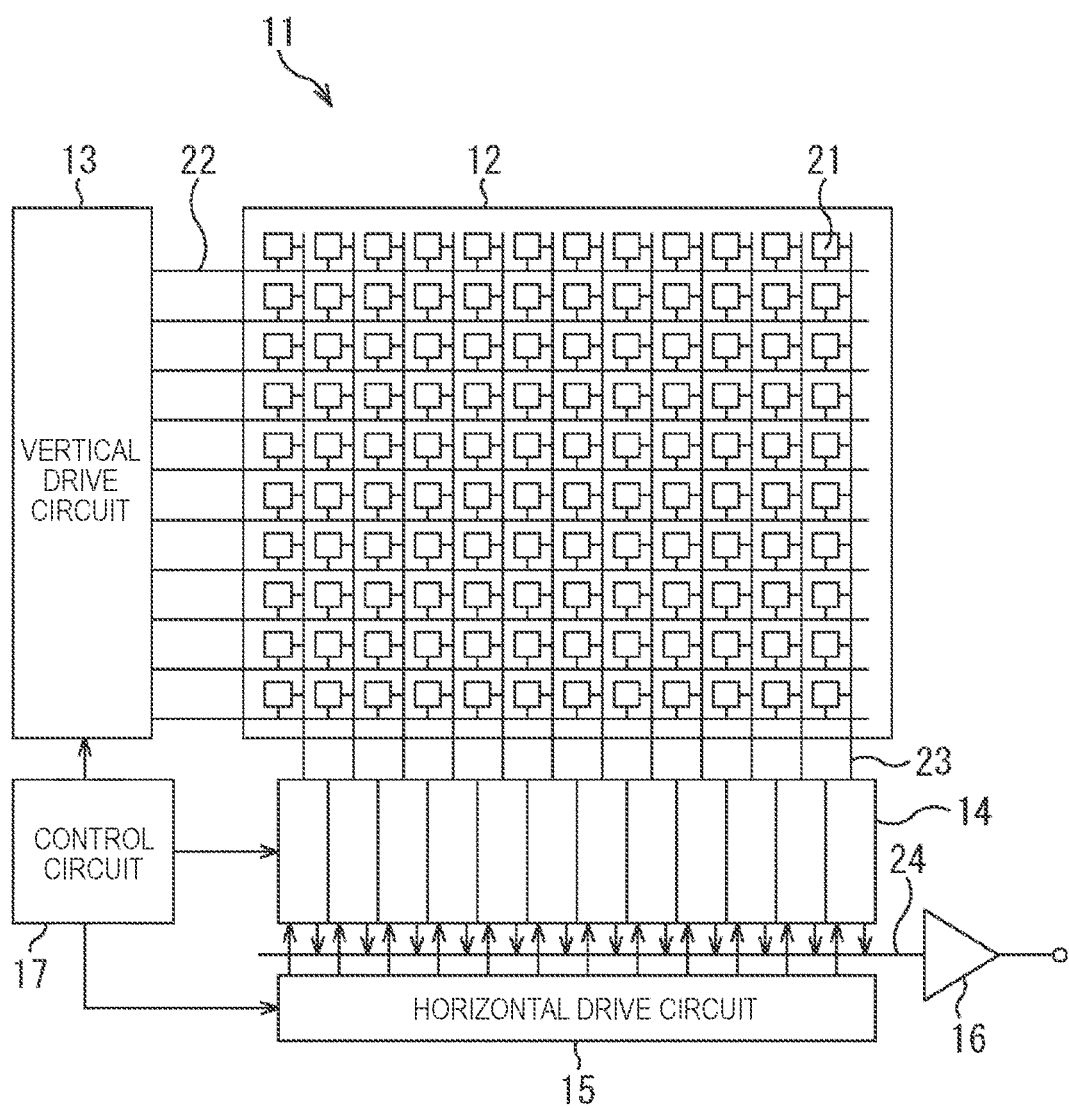
FIG. 1 is a block diagram illustrating a configuration example of an embodiment of an image sensor to which the present technology is applied.

FIG. 1 is a block diagram illustrating a configuration example of an embodiment of an image sensor to which the present technology is applied.

As illustrated in FIG. 1, an image sensor 11 includes a pixel region 12, a vertical drive circuit 13, a column signal processing circuit 14, a horizontal drive circuit 15, an output circuit 16, and a control circuit 17.

The pixel region 12 is a light receiving surface that receives light collected by an optical system (not illustrated). In the pixel region 12, a plurality of pixels 21 are arranged in a matrix form, and each of the pixels 21 is connected to the vertical drive circuit 13 row by row through a horizontal signal line 22 and is connected to the column signal processing circuit 14 column by column through a vertical signal line 23. Each of the plurality of pixels 21 output a pixel signal at a level corresponding to the quantity of light to be received, and an image of a photographic subject to be formed on the pixel region 12 is constructed from these pixel signals.

The vertical drive circuit 13 supplies a drive signal, which is used to drive (transfer, select, reset, or the like) each pixel 21 sequentially for each row of the plurality of pixels 21 arranged in the pixel region 12, to the pixel 21 through the horizontal signal line 22. The column signal processing circuit 14 performs the correlated double sampling (CDS) processing on pixel signals that are output from the plurality of pixels 21 through the vertical signal line 23, thereby performing AD conversion on the pixel signals and removing reset noise.

The horizontal drive circuit 15 supplies a drive signal, which is used to cause the column signal processing circuit 14 to output a pixel signal to a data output signal line 24, to the column signal processing circuit 14 sequentially for each column of the plurality of pixels 21 arranged in the pixel region 12. The output circuit 16 amplifies the pixel signal supplied from the column signal processing circuit 14 through the data output signal line 24 at the timing in accordance with the drive signal of the horizontal drive circuit 15 and outputs it to a signal processing circuit of the following stage. The control circuit 17 generates and supplies, in one example, a clock signal in accordance with the driving cycle of each block of the image sensor 11, thereby controlling the driving of these respective blocks.

Figure 2:
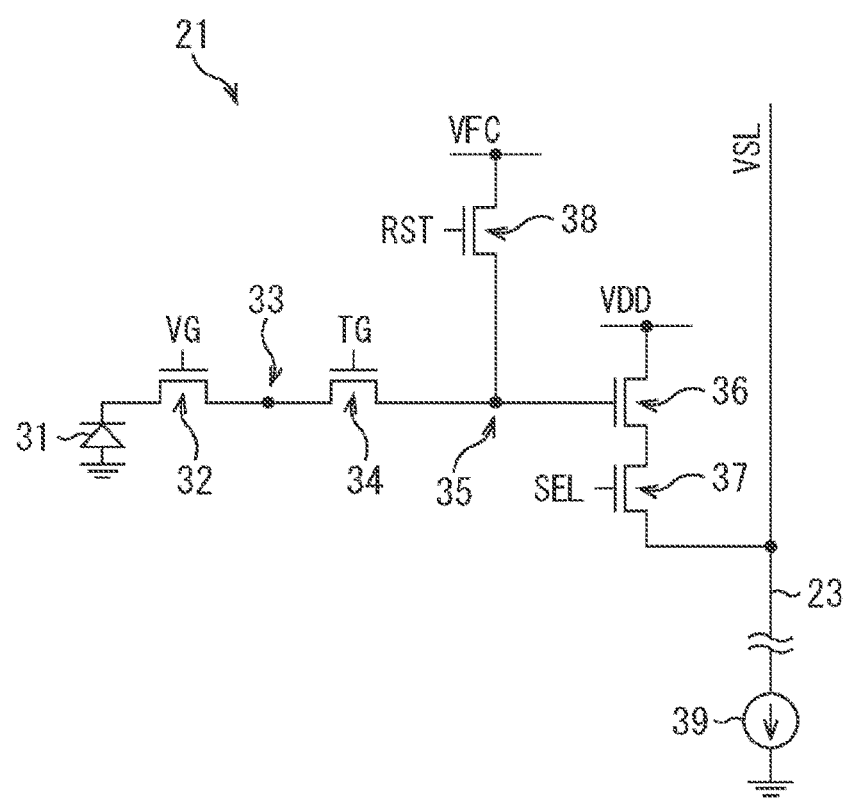
FIG. 2 is a circuit diagram illustrating a configuration example of a pixel.

Next, FIG. 2 is a circuit diagram illustrating a configuration example of the pixel 21.

As illustrated in FIG. 2, the pixel 21 includes a PD 31, a first transfer transistor 32, a multiplication region 33, a second transfer transistor 34, a floating diffusion (FD) portion 35, an amplification transistor 36, a selection transistor 37, and a reset transistor 38, and is connected to a constant current source 39 through the vertical signal line 23.

The PD 31 is a photoelectric conversion unit that converts incident light into electric charge by photoelectric conversion and stores it, and has an anode grounded and a cathode connected to the first transfer transistor 32.

The first transfer transistor 32 is driven in accordance with a transfer signal VG supplied from the vertical drive circuit 13, and when the first transfer transistor 32 is turned on, the electric charge stored in the PD 31 is transferred to the multiplication region 33.

The multiplication region 33 is a floating diffusion region that has predetermined storage capacity and is provided between the first transfer transistor 32 and the second transfer transistor 34, and temporarily stores the electric charge transferred from the PD 31. In addition, the multiplication region 33 is capable of multiplying electrons by producing an intense electric field region therein to cause avalanche effect (i.e., a phenomenon in which free electrons collide with molecules in an intense electric field, releasing additional electrons which accelerate and collide with other molecules in an electric field, so the number of electrons increases with increasing speed).

The second transfer transistor 34 is driven in accordance with a transfer signal TG supplied from the vertical drive circuit 13, and when the second transfer transistor 34 is turned on, the electric charge stored in the multiplication region 33 is transferred to the FD portion 35.

The FD portion 35 is a floating diffusion region that has predetermined storage capacity and is connected to the gate electrode of the amplification transistor 36, and temporarily stores the electric charge transferred through the multiplication region 33.

The amplification transistor 36 outputs a pixel signal at a level (i.e., the potential of the FD portion 35) corresponding to the electric charge stored in the FD portion 35 to the vertical signal line 23 through the selection transistor 37. Specifically, the configuration in which the FD portion 35 is connected to the gate electrode of the amplification transistor 36 allows the FD portion 35 and the amplification transistor 36 to amplify the electric charge generated in the PD 31 and to function as a conversion unit that converts it into a pixel signal at the level corresponding to the electric charge.

The selection transistor 37 is driven in accordance with a selection signal SEL supplied from the vertical drive circuit 13, and when the selection transistor 37 is turned on, the pixel signal output from the amplification transistor 36 is ready to be outputted to the vertical signal line 23.

The reset transistor 38 is driven in accordance with a reset signal RST supplied from the vertical drive circuit 13, and when the reset transistor 38 is turned on, the electric charge stored in the FD portion 35 is discharged to a variable power source VFC, and the FD portion 35 is reset. In this regard, the variable power source VFC can change the voltage so that the reset potential of the multiplication region 33 is different from that of the FD portion 35, as described with reference to FIGS. 4 to 7.

The pixel 21 configured as described above makes it possible for the electric charge (electrons) generated in the PD 31 to be multiplied by reading out it through the multiplication region 33.

Figure 3:
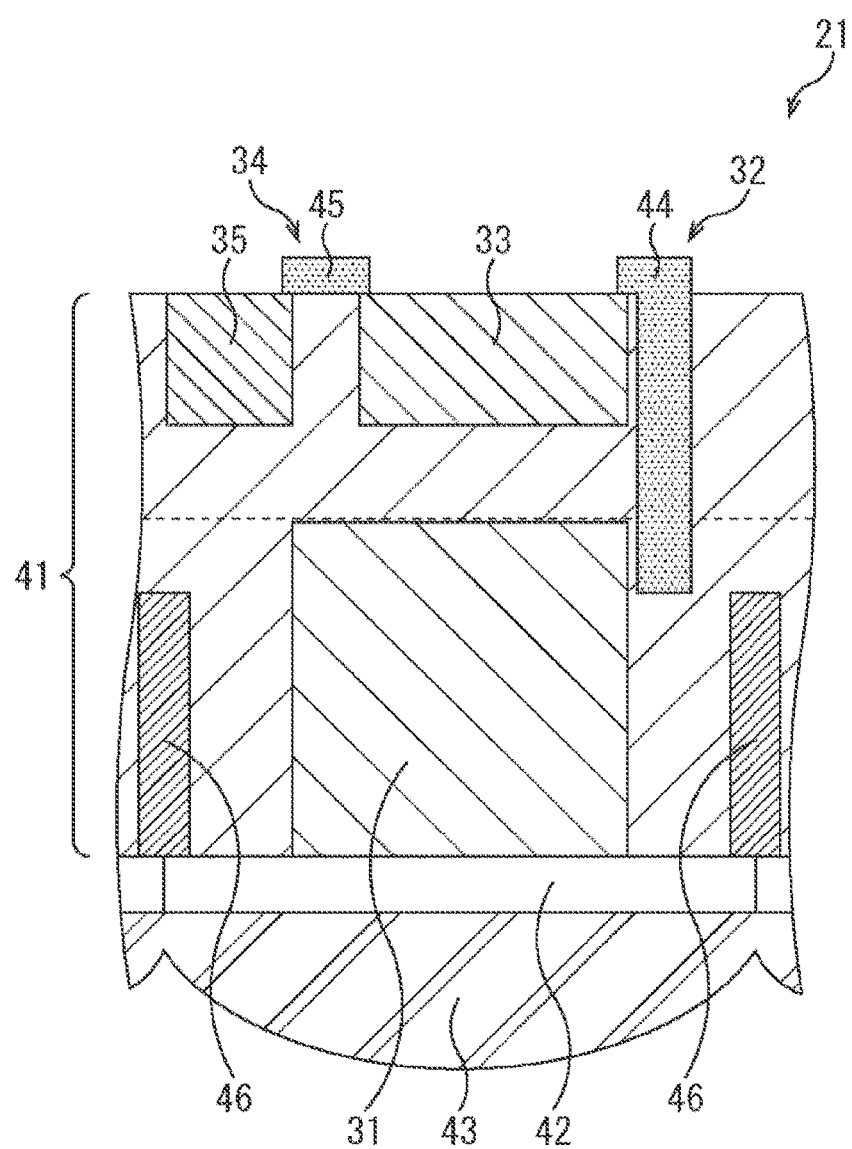
FIG. 3 is a cross-sectional view illustrating a first configuration example of a pixel.

Next, FIG. 3 is a cross-sectional view illustrating a first configuration example of the pixel 21.

As illustrated in FIG. 3, in the pixel 21, the PD 31 is formed on the back surface side (the lower side in FIG. 2) of a semiconductor substrate 41, and the PD 31 is irradiated with light from the back surface side of the semiconductor substrate 41. Then, a color filter 42 and an on-chip lens 43 are stacked on the back surface side of the semiconductor substrate 41. The color filter 42 transmits light of a color received by the pixel 21, and the on-chip lens 43 collects light for each pixel 21.

Further, in the pixel 21, the first transfer transistor 32, the multiplication region 33, the second transfer transistor 34, and the FD portion 35 are arranged on the front surface side of the semiconductor substrate 41.

The first transfer transistor 32 has a gate electrode 44 provided to be defined by digging a trench from the front surface of the semiconductor substrate 41 to the vicinity of the side surface of the PD 31 at a portion adjacent to the multiplication region 33. In other words, the first transfer transistor 32 has a so-called vertical transistor structure, and the electric charge generated in the PD 31 is read out to the front surface of the semiconductor substrate 41 and is transferred to the multiplication region 33.

The multiplication region 33 is arranged on the front surface side of the semiconductor substrate 41 so that it is stacked on the PD 31 arranged on the back surface side of the semiconductor substrate 41, and stores electric charge to be read out through the first transfer transistor 32. In addition, in the multiplication region 33, in one example, when the electric charge is transferred from the multiplication region 33 to the FD region 35, a high voltage is applied to the second transfer transistor 34. Thus, an avalanche effect is created by producing an intense electric field region inside the multiplication region 33, thereby multiplying electrons. Furthermore, in this event, application of an optional negative bias to the first transfer transistor 32 makes it possible to enhance the multiplication effect of electrons.

The second transfer transistor 34 has a gate electrode 45 provided to be stacked on the front surface of the semiconductor substrate 41 between the multiplication region 33 and the FD portion 35. Then, the second transfer transistor 34 transfers the electric charge, which is read out from the PD 31 and is stored in the multiplication region 33, to the FD portion 35.

The FD portion 35 stores the electric charge transferred from the multiplication region 33 through the second transfer transistor 34 and is connected to the gate electrode of the amplification transistor 36 as described above with reference to FIG. 2.

Further, the pixel 21 is provided with a light blocking portion 46 capable of blocking light to prevent the light incident on other pixels 21 adjacent thereto from entering the pixel 21 so that the light blocking portion 46 is embedded from the back surface side of the semiconductor substrate 41 to a predetermined depth in such a way as to enclose the periphery of the PD 31.

The pixel 21 configured as described above has, in one example, the structure in which the PD 31, the multiplication region 33, and the PD 31 are provided in such a way to be stacked vertically above one another, thereby achieving the size reduction.

Furthermore, in the pixel 21, it is possible to multiply the electric charge (electrons) generated in the PD 31 by reading out it through the multiplication region 33. This makes it possible for the pixel 21 to obtain a pixel signal with high sensitivity, in one example, even at low illuminance.

Then, the image sensor 11 including the pixel 21 can employ a structure similar to that of the CMOS image sensor in related art with respect to the photoelectric conversion characteristics in the PD 31 or the electric-charge transfer conversion characteristics from the PD 31. Furthermore, in the image sensor 11, the number of transistors necessary for the pixel 21 can be made smaller than that of the APD in related art, and so it is possible to achieve size reduction of the pixel 21, thereby being configured with the higher integration and being provided with the multiplication function.

Figure 4:
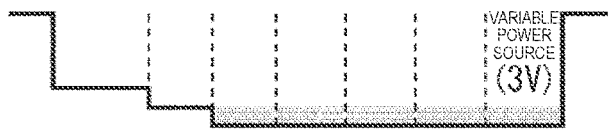
FIG. 4 is a diagram illustrated to describe a first driving method of a pixel.
Figure 4:
Figure 4:
Figure 4:
Figure 4:
Figure 4:
Figure 4:
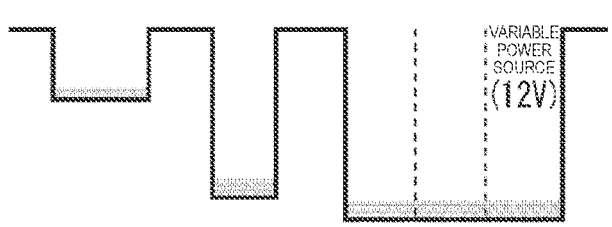
Figure 4:
Figure 4:
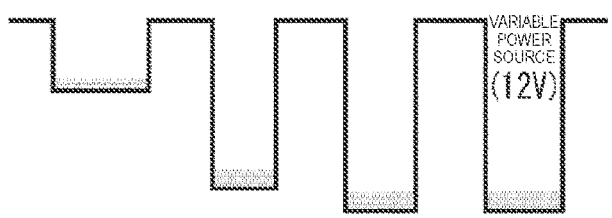
Figure 4:
Figure 5:
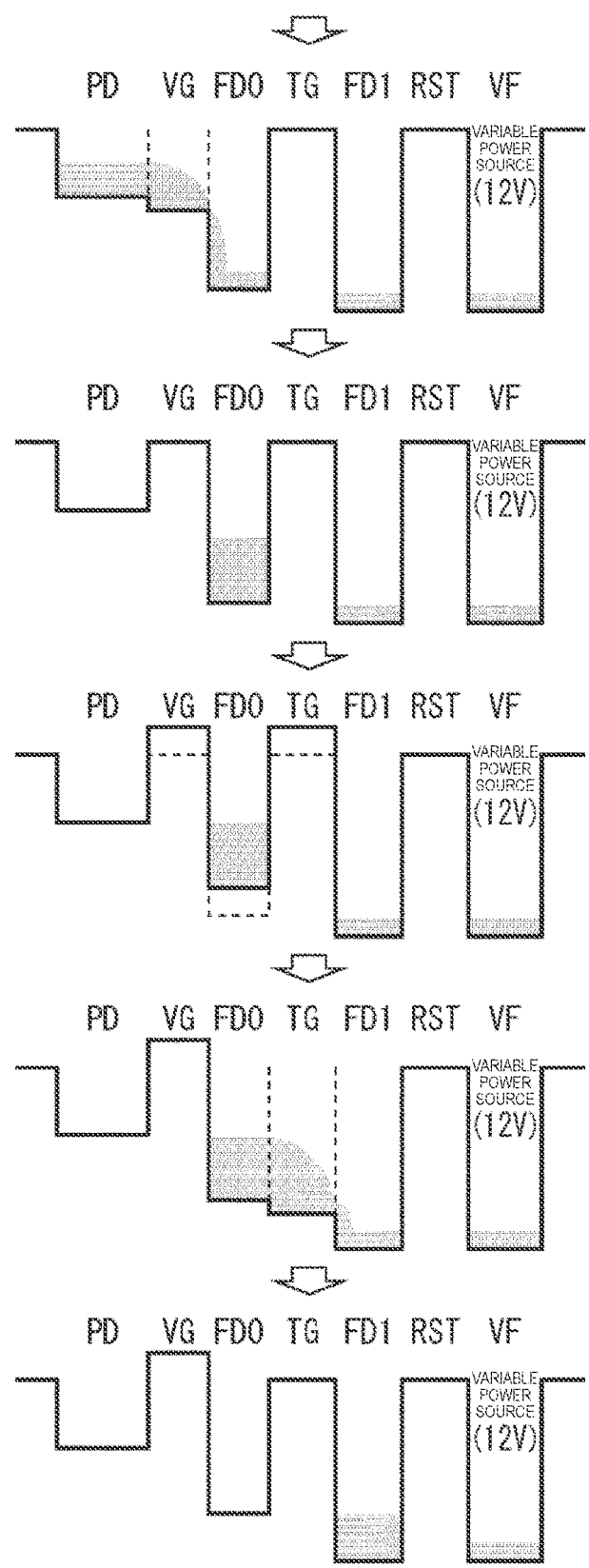
FIG. 5 is a diagram illustrated to describe a first driving method of a pixel.

Next, a first driving method of the pixel 21 will be described with reference to FIGS. 4 and 5. FIGS. 4 and 5 illustrate an electric potential of the PD 31 (PD), an electric potential of the transfer signal of the first transfer transistor 32 (VG), an electric potential of the multiplication region 33 (FD0), an electric potential of the transfer signal of the second transfer transistor 34 (TG), an electric potential of the FD portion 35 (FD1), an electric potential of the reset signal of the reset transistor 38 (RST), and an electric potential of the variable power source VFC (VF).

In the first step, as shown in the uppermost stage in FIG. 4, the electric potential of the variable power source is set to, in one example, 3 V, and the first transfer transistor 32, the second transfer transistor 34, and the reset transistor 38 are driven to be turned on. This causes the electric charge remaining in the PD 31 to be discharged through the reset transistor 38, the FD portion 35, the second transfer transistor 34, the multiplication region 33, and the first transfer transistor 32, then the PD 31 is reset.

In the second step, as shown in the second stage from the top in FIG. 4, the first transfer transistor 32 is driven to be turned off. This causes the PD 31 to start to store the electric charge generated by photoelectric conversion.

In the third step, as shown in the third stage from the top in FIG. 4, the electric potential of the variable power source VFC is changed to, in one example, 11 V. This causes the multiplication region 33 to be reset to 11 V through the reset transistor 38, the FD portion 35, and the second transfer transistor 34.

In the fourth step, as shown in the fourth stage from the top in FIG. 4, the second transfer transistor 34 is driven to be turned off, and then the electric potential of the variable power source VFC is changed to, in one example, 12 V. This causes the FD portion 35 to be reset to 12 V through the reset transistor 38.

In the fifth step, as shown in the fifth stage from the top in FIG. 4, the reset transistor 38 is driven to be turned off, and then the reset operation is terminated.

Next, in the sixth step, as shown in the uppermost stage in FIG. 5, the first transfer transistor 32 is driven to be turned on. This causes the storage of electric charge in the PD 31 to be terminated and causes the transfer of electric charge from the PD 31 to the multiplication region 33 to be performed while occurring the multiplication. In this event, an intense electric field region is caused to be produced in the multiplication region 33 to multiply the electric charge by the avalanche effect.

In the seventh step, as shown in the second stage from the top in FIG. 5, the first transfer transistor 32 is driven to be turned off. This causes the transfer of electric charge from the PD 31 to the multiplication region 33 to be terminated.

In the eighth step, as shown in the third stage from the top in FIG. 5, a negative bias is applied to the first transfer transistor 32 and the second transfer transistor 34. This causes the electric potential of the multiplication region 33 to be stepped down.

In the ninth step, as shown in the fourth stage from the top in FIG. 5, the second transfer transistor 34 is driven to be turned on. This causes the transfer of electric charge from the multiplication region 33 to the FD portion 35 to be performed normally.

In the tenth step, as shown in the fifth stage from the top in FIG. 5, the second transfer transistor 34 is driven to be turned off. This causes the transfer of electric charge from the multiplication region 33 to the FD portion 35 to be terminated. Then, a pixel signal at a level corresponding to the electric charge stored in the FD portion 35 is output from the amplification transistor 36 in FIG. 2.

Such a first driving method makes it possible for the pixel 21 to multiply the electric charge generated in the PD 31 when the electric charge is read out to the multiplication region 33.

Next, a second driving method of the pixel 21 will be described with reference to FIGS. 6 and 7.

Figure 6:
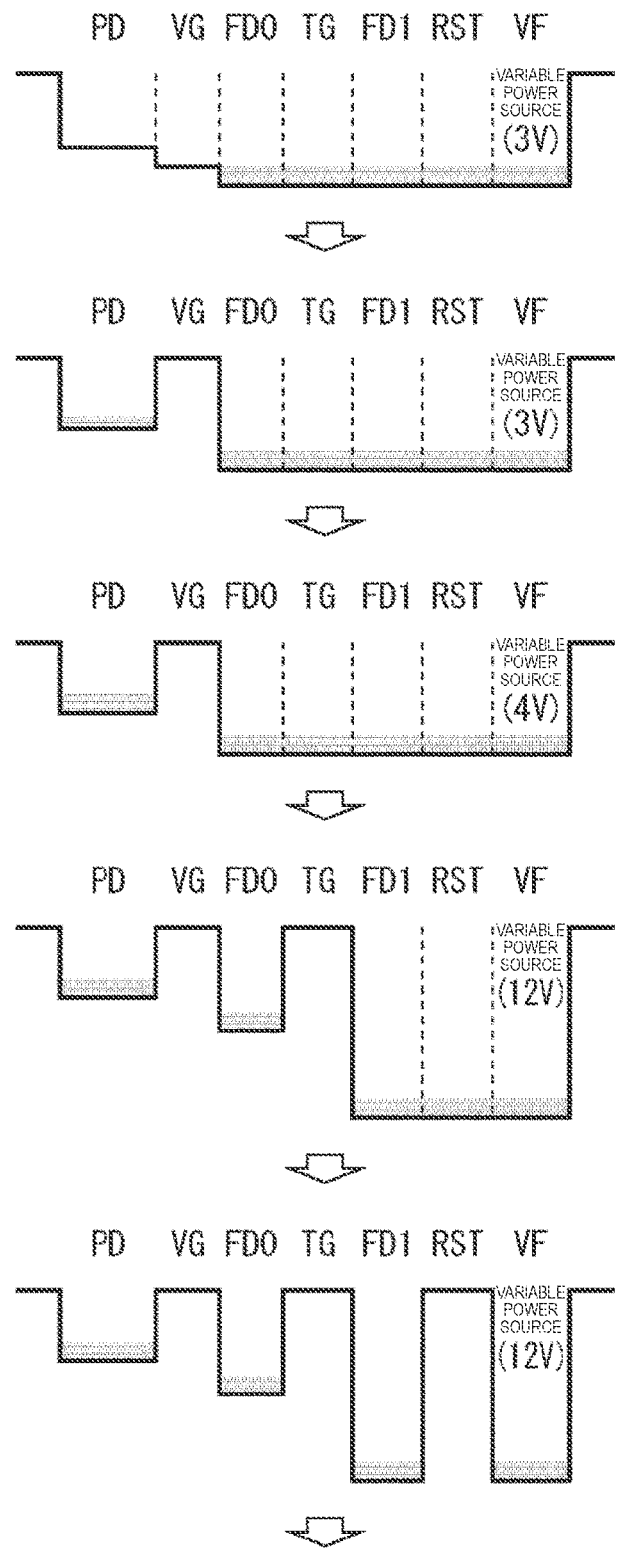
FIG. 6 is a diagram illustrated to describe a second driving method of a pixel.

In the twenty-first step, as shown in the uppermost stage in FIG. 6, the electric potential of the variable power source is set to, in one example, 3 V, and the first transfer transistor 32, the second transfer transistor 34, and the reset transistor 38 are driven to be turned on. This causes the electric charge remaining in the PD 31 to be discharged through the reset transistor 38, the FD portion 35, the second transfer transistor 34, the multiplication region 33, and the first transfer transistor 32, and then the PD 31 is reset.

In the twenty-second step, as shown in the second stage from the top in FIG. 6, the first transfer transistor 32 is driven to be turned off. This causes the PD 31 to start to store the electric charge generated by photoelectric conversion.

In the twenty-third step, as shown in the third stage from the top in FIG. 6, the electric potential of the variable power source VFC is changed to, in one example, 4 V. This causes the multiplication region 33 to be reset to 4 V through the reset transistor 38, the FD portion 35, and the second transfer transistor 34.

In the twenty-fourth step, as shown in the fourth stage from the top in FIG. 6, the second transfer transistor 34 is driven to be turned off, and then the electric potential of the variable power source VFC is changed to, in one example, 12 V. This causes the FD portion 35 to be reset to 12 V through the reset transistor 38.

In the twenty-fifth step, as shown in the fifth stage from the top in FIG. 6, the reset transistor 38 is driven to be turned off, and then the reset operation is terminated.

Figure 7:
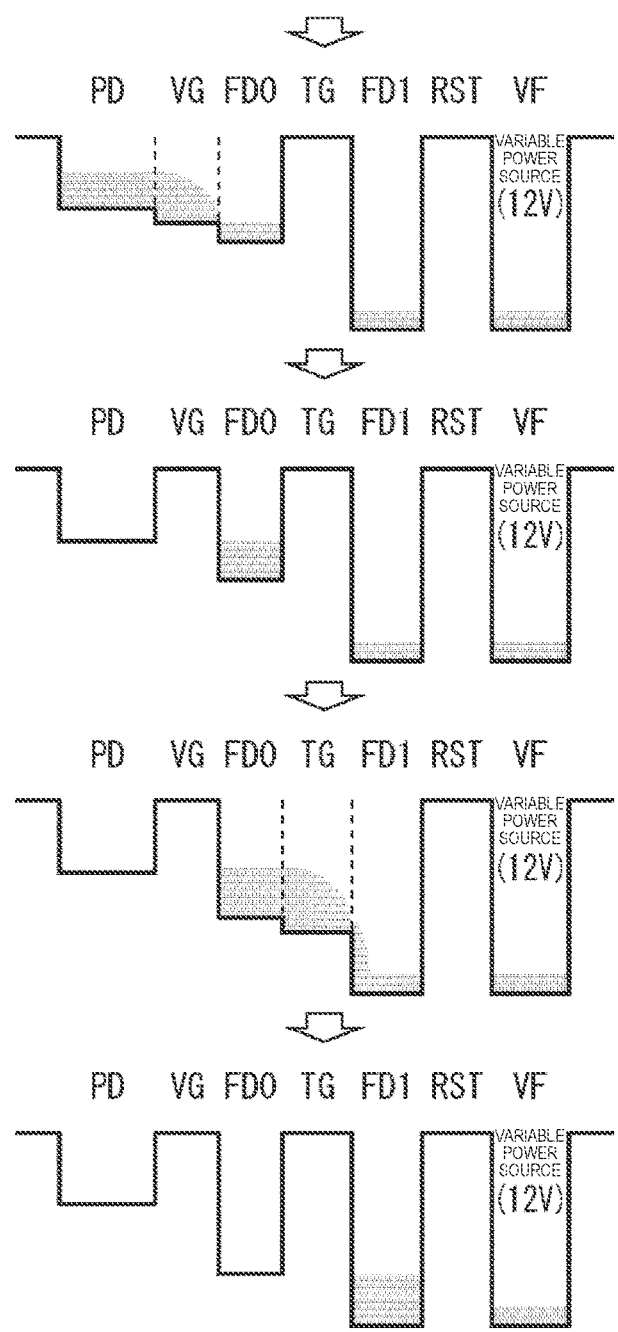
FIG. 7 is a diagram illustrated to describe a first driving method of a pixel.

Next, in the twenty-sixth step, as shown in the uppermost stage in FIG. 7, the first transfer transistor 32 is driven to be turned on. This causes the storage of electric charge in the PD 31 to be terminated and causes the transfer of electric charge from the PD 31 to the multiplication region 33 to be performed normally.

In the twenty-seventh step, as shown in the second stage from the top in FIG. 7, the first transfer transistor 32 is driven to be turned off. This causes the transfer of electric charge from the PD 31 to the multiplication region 33 to be terminated.

In the twenty-eighth step, as shown in the third stage from the top in FIG. 7, the second transfer transistor 34 is driven to be turned on. This causes the transfer of electric charge from the multiplication region 33 to the FD portion 35 to be performed while occurring the multiplication. In this event, an intense electric field region is caused to be produced in the multiplication region 33 to multiply the electric charge by the avalanche effect.

In the twenty-ninth step, as shown in the fourth stage from the top in FIG. 7, the second transfer transistor 34 is driven to be turned off. This causes the transfer of electric charge from the multiplication region 33 to the FD portion 35 to be terminated. Then, a pixel signal at a level corresponding to the electric charge stored in the FD portion 35 is output from the amplification transistor 36 in FIG. 2.

Such a second driving method makes it possible for the pixel 21 to multiply the electric charge generated in the PD 31 and read out to the multiplication region 33 when the electric charge is transferred to the FD portion 35. Furthermore, employing the second driving method makes it possible to separate the portion for reading out the electric charge from the PD 31 and the portion for multiplying the electric charge, and these portions can be designed as independent device structure.

Next, a first manufacturing method of the pixel 21 will be described with reference to FIG. 8.

Figure 8:
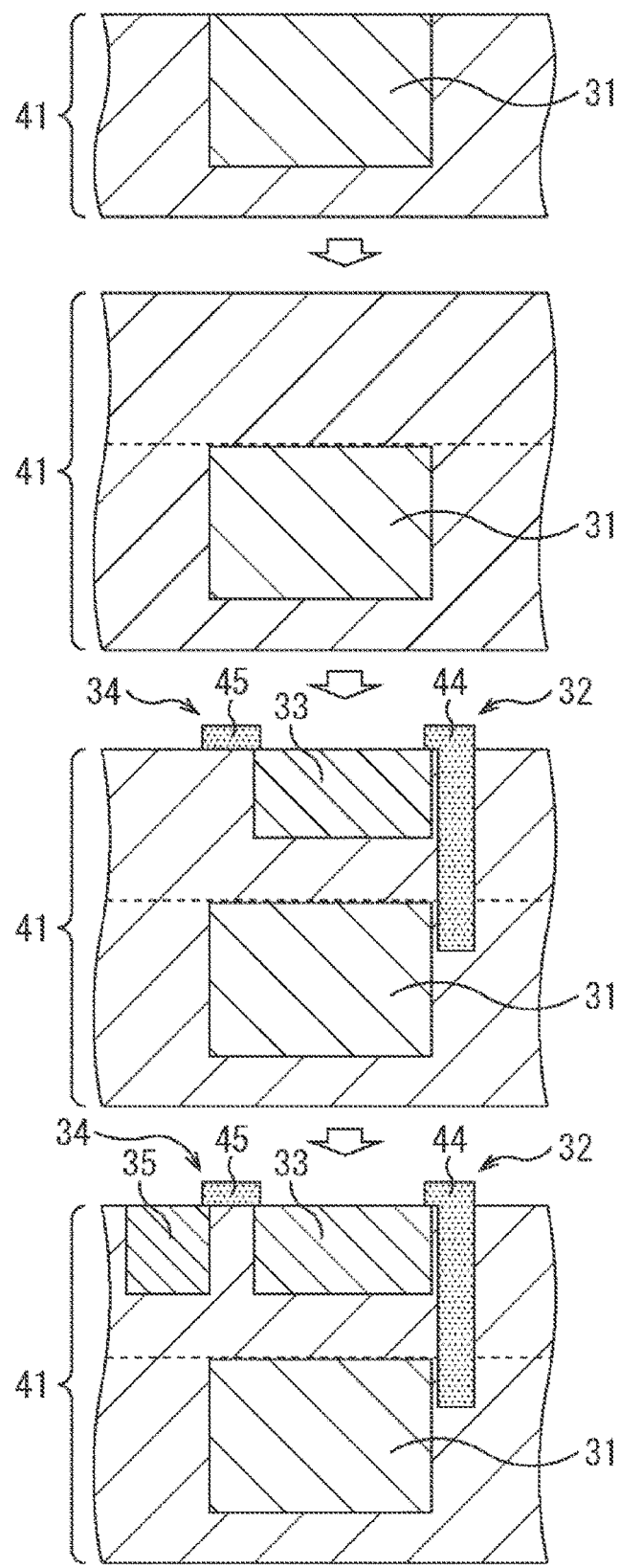
FIG. 8 is a diagram illustrated to describe a first manufacturing method of a pixel.

In the first process, as shown in the uppermost stage in FIG. 8, impurities are ion-implanted into the semiconductor substrate 41 to form the PD 31 in the vicinity of the front surface of the semiconductor substrate 41.

In the second process, as shown in the second stage from the top in FIG. 8, crystal growth is performed on the semiconductor substrate 41 to form an epitaxial layer.

In the third process, as shown in the third stage from the top in FIG. 8, impurities are ion-implanted into the epitaxial layer of the semiconductor substrate 41 to form the multiplication region 33. Furthermore, a trench is defined in the semiconductor substrate 41 by digging it to the vicinity of the side surface of the PD 31 at a portion adjacent to the multiplication region 33 and then a conductor is deposited onto the trench to form the gate electrode 44, and so the first transfer transistor 32 is provided. In this event, the gate electrode 45 is formed to be stacked on the semiconductor substrate 41, and so the second transfer transistor 34 is provided.

In the fourth process, as shown in the fourth stage from the top in FIG. 8, impurities are ion-implanted into the epitaxial layer of the semiconductor substrate 41 to form the FD portion 35. Then, the pixel 21 is manufactured through a process of thinning the back surface side of the semiconductor substrate 41, stacking the color filter 42 and the on-chip lens 43 thereon, and providing a wiring layer (not illustrated) or the like.

As described above, it is possible for the pixel 21 to have a structure in which the PD 31 and the multiplication region 33 are stacked on each other by forming the PD 31 in the semiconductor substrate 41, and forming the epitaxial layer, then forming the multiplication region 33 in the epitaxial layer.

Next, a second manufacturing method of the pixel 21 will be described with reference to FIG. 9.

Figure 9:
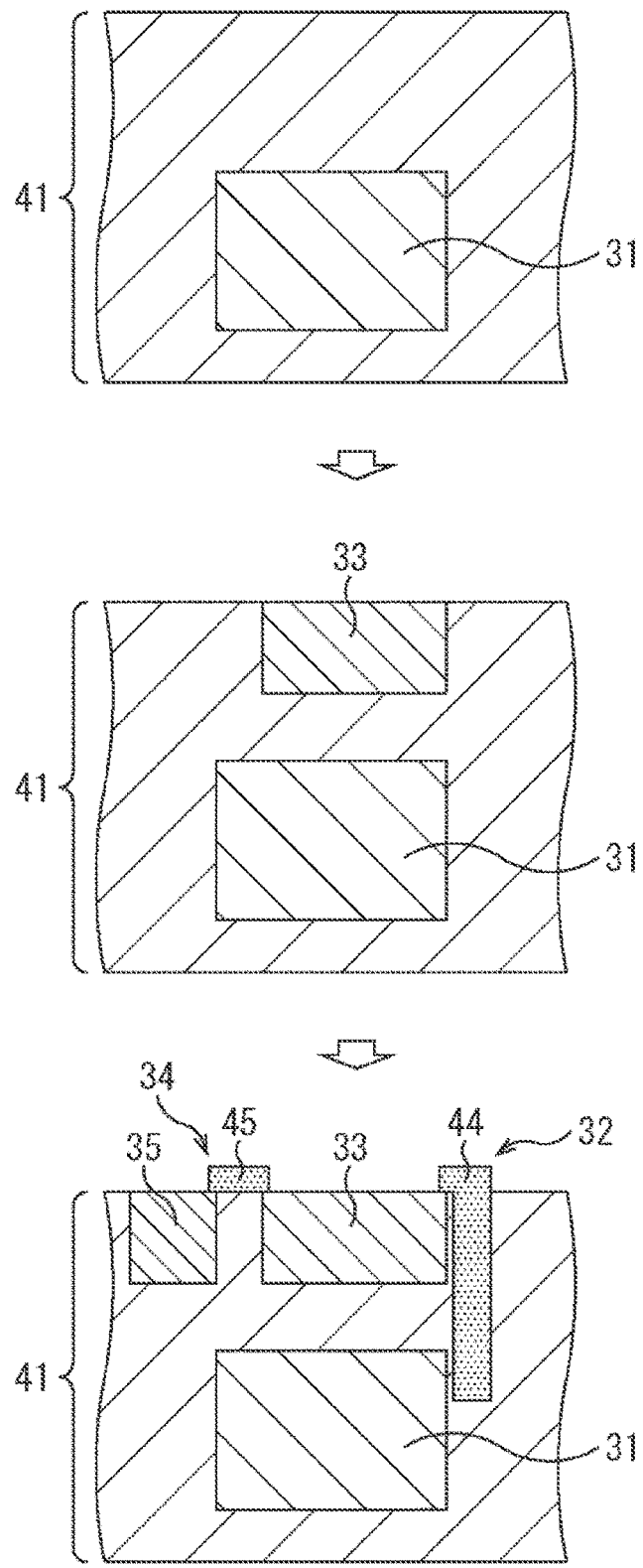
FIG. 9 is a diagram illustrated to describe a second manufacturing method of a pixel.

In the eleventh process, as shown in the upper stage in FIG. 9, impurities are ion-implanted into the semiconductor substrate 41 to form the PD 31 in the deep portion of the semiconductor substrate 41.

In the twelfth process, as shown in the middle stage in FIG. 9, impurities are ion-implanted into the semiconductor substrate 41 to form the multiplication region 33 in the vicinity of the front surface of the semiconductor substrate 41.

In the twelfth process, as shown in the lower stage in FIG. 9, the gate electrode 44 and the gate electrode 45 are formed to provide the first transfer transistor 32 and the second transfer transistor 34, respectively, and then the FD portion 35 is formed. Then, the pixel 21 is manufactured through a process of thinning the back surface side of the semiconductor substrate 41, stacking the color filter 42 and the on-chip lens 43 thereon, and providing a wiring layer (not illustrated) or the like.

As described above, it is possible for the pixel 21 to have a structure in which the PD 31 and the multiplication region 33 are stacked on each other by separately forming the PD 31 and the multiplication region 33 by separating the depth direction when impurities are ion-implanted into the same semiconductor substrate 41.

Next, a third manufacturing method of the pixel 21 will be described with reference to FIG. 10.

Figure 10:
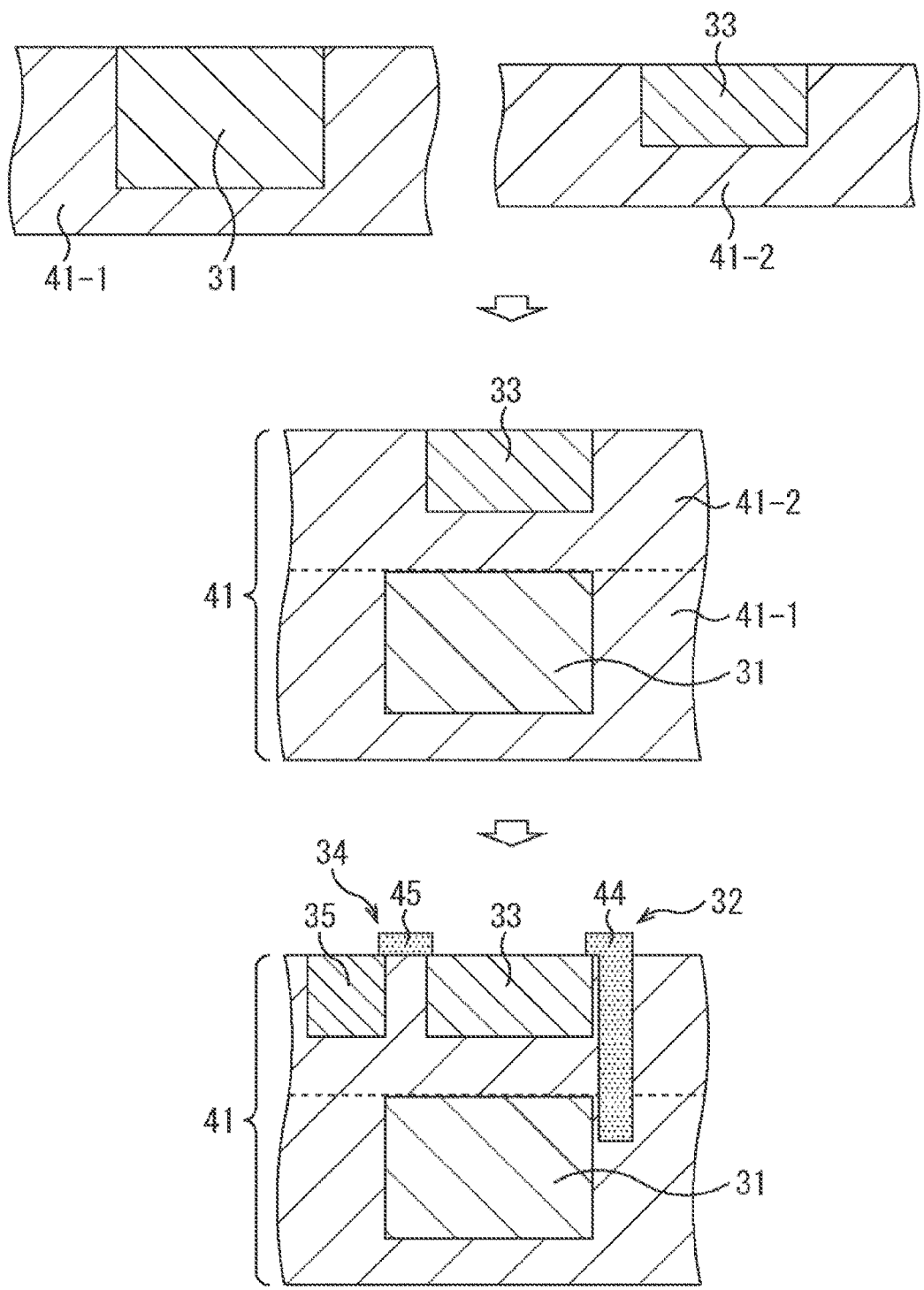
FIG. 10 is a diagram illustrated to describe a third manufacturing method of a pixel.

In the twenty-first process, as shown in the upper stage in FIG. 10, the PD 31 is formed in a first semiconductor substrate 41-1, and the multiplication region 33 is formed in a second semiconductor substrate 41-2.

In the twenty-second process, as shown in the middle stage in FIG. 10, the first semiconductor substrate 41-1 and the second semiconductor substrate 41-2 are bonded to each other.

In the twenty-third process, as shown in the lower stage in FIG. 10, the gate electrode 44 and the gate electrode 45 are formed to provide the first transfer transistor 32 and the second transfer transistor 34, respectively, and then the FD portion 35 is formed. Then, the pixel 21 is manufactured through a process of thinning the back surface side of the semiconductor substrate 41, stacking the color filter 42 and the on-chip lens 43 thereon, and providing a wiring layer (not illustrated) or the like.

As described above, the PD 31 and the multiplication region 33 are formed in the first semiconductor substrate 41-1 and the second semiconductor substrate 41-2, respectively. The semiconductor substrate 41 is formed by bonding first semiconductor substrate 41-1 and the second semiconductor substrate 41-2 to each other. Accordingly, the pixel 21 can have a structure in which the PD 31 and the multiplication region 33 are stacked on each other.

The pixel 21 having the structure in which the PD 31 and the multiplication region 33 are stacked on each other may be manufactured by employing any one of the first to third manufacturing methods as described above. Moreover, it is possible to employ methods other than the above-described manufacturing methods as long as the PD 31 and the multiplication region 33 can be stacked on each other.

Figure 11:
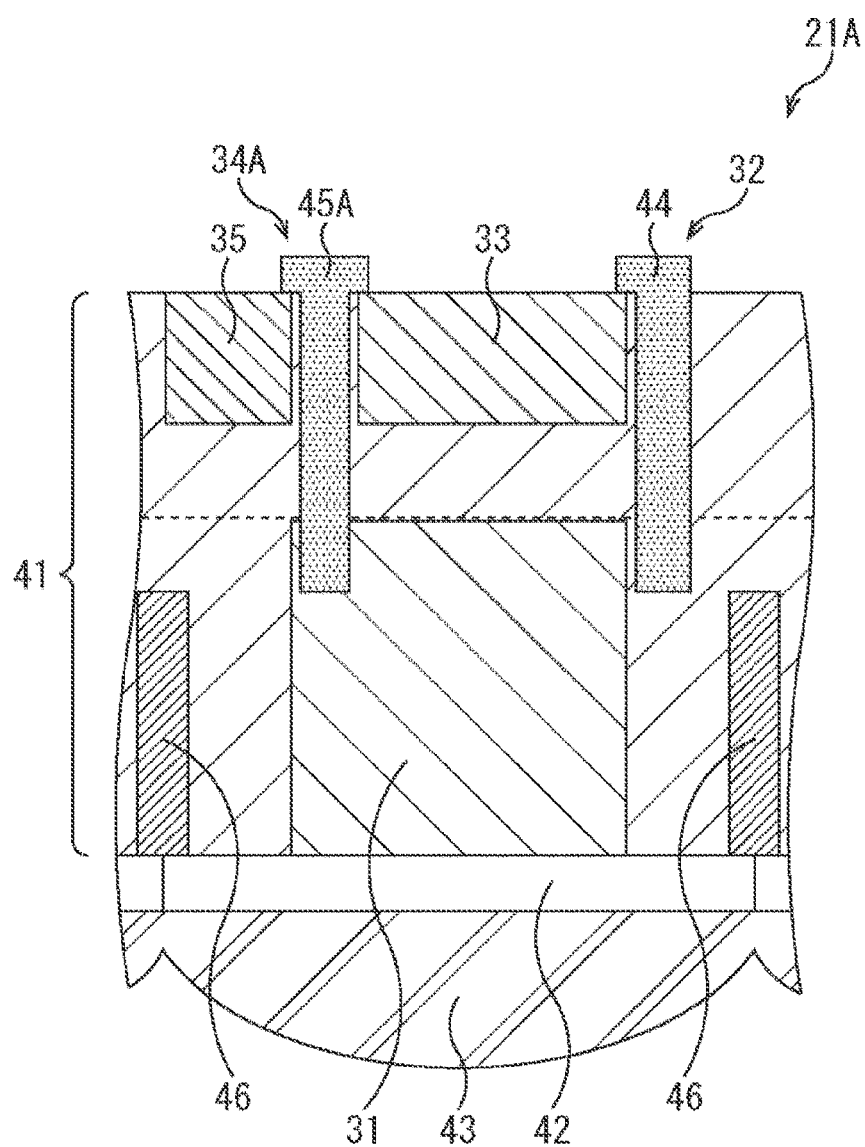
FIG. 11 is a circuit diagram illustrating a second configuration example of a pixel.

Next, FIG. 11 is a cross-sectional view illustrating a second configuration example of the pixel 21. Moreover, in a pixel 21A illustrated in FIG. 11, the components common to those of the pixel 21 in FIG. 3 are denoted by the same reference numerals, and a detailed description thereof will be omitted.

Specifically, the pixel 21A has a structure common to that of the pixel 21 in FIG. 3 in that the PD 31, the first transfer transistor 32, the multiplication region 33, the FD portion 35, and the light blocking portion 46 are provided in the semiconductor substrate 41, and the color filter 42 and the on-chip lens 43 are stacked on the back surface of the semiconductor substrate 41. On the other hand, in the pixel 21A, the structure of a second transfer transistor 34A is different from that of the second transfer transistor 34 of the pixel 21 in FIG. 3.

As illustrated in FIG. 11, the second transfer transistor 34A has a gate electrode 45A formed to be embedded in the semiconductor substrate 41 in such a way that it extends from the front surface side of the semiconductor substrate 41 to the PD 31. In other words, the second transfer transistor 34A has a so-called vertical transistor structure, which is similar to the first transfer transistor 32.

Thus, the pixel 21A can read out electric charge directly from the PD 31 to the FD portion 35 through the second transfer transistor 34A when the second transfer transistor 34A is driven to be turned on in a state where electric charge is stored in the PD 31. Specifically, the pixel 21A can read out the electric charge stored in the PD 31 by two driving methods, that is, the driving method of reading out electric charge from the PD 31 through the first transfer transistor 32 and the driving method of reading out electric charge from the PD 31 through the second transfer transistor 34A.

This makes it possible for the pixel 21A to switch the driving methods of reading out the electric charge from the PD 31, in one example, depending on the brightness of light that irradiates the image sensor 11.

In one example, when light irradiating the image sensor 11 has normal brightness, in the pixel 21A, the driving method of reading out the electric charge directly from the PD 31 to the FD portion 35 through the second transfer transistor 34A is used. Thereby, in a case where a photographic subject has normal brightness, a pixel signal in which the electric charge is not multiplied is read out.

On the other hand, when the light irradiating the image sensor 11 is darker than normal brightness, in the pixel 21A, a driving method of reading out the electric charge from the PD 31 to the multiplication region 33 through the first transfer transistor 32, amplifying it, and then transferring the electric charge to the FD portion 35 through the transfer transistor 34A is used. Thereby, in the case where a photographic subject is darker than normal brightness, a pixel signal in which the electric charge is multiplied is read out. Moreover, when the electric charge is transferred from the multiplication region 33 to the FD portion 35 by this driving method, the electric charge of the PD 31 has been read out through the first transfer transistor 32, and so no electric charge is read out from the PD 31 through the second transfer transistor 34A.

The pixel 21A configured as described above is capable of switching the driving methods of reading out the electric charge from the PD 31, thereby capturing an image with appropriate exposure depending on, in one example, the brightness of a photographic subject.

Figure 12:
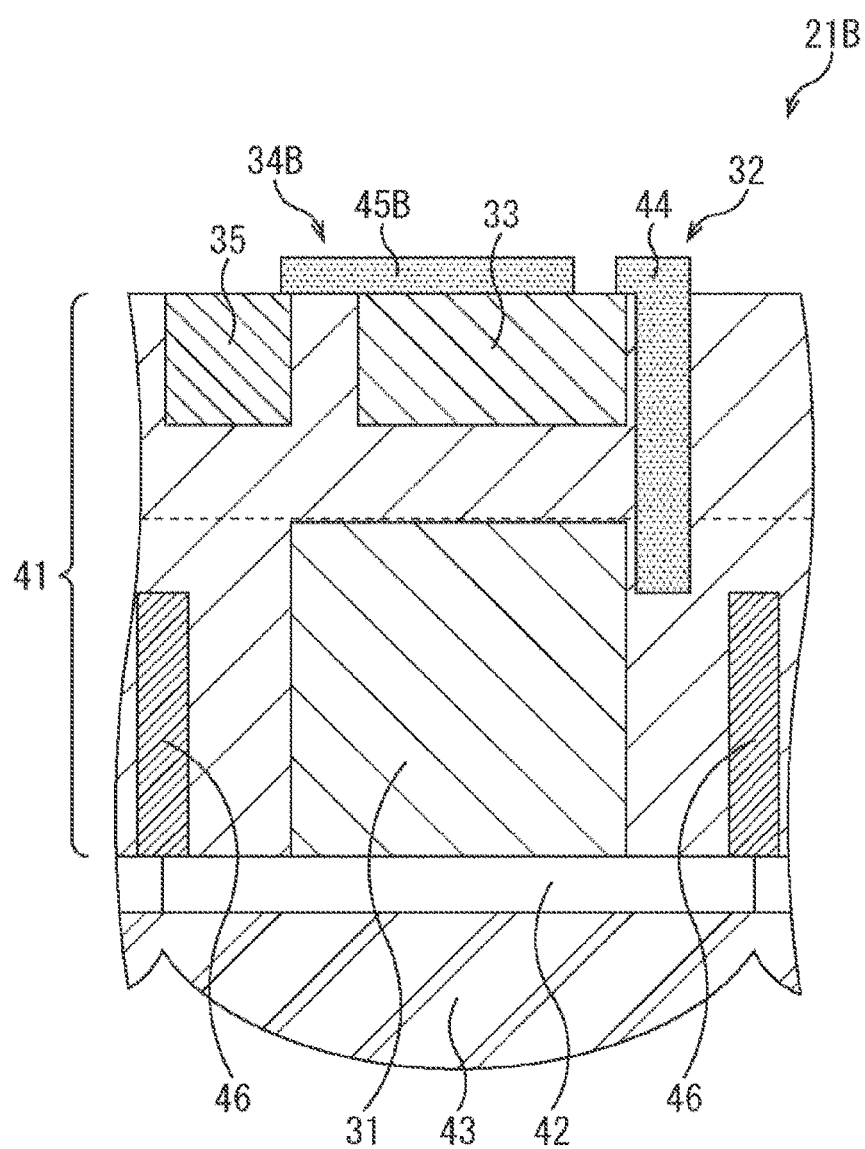
FIG. 12 is a circuit diagram illustrating a third configuration example of a pixel.

Next, FIG. 12 is a cross-sectional view illustrating a third configuration example of the pixel 21. Moreover, in a pixel 21B illustrated in FIG. 12, the components common to those of the pixel 21 in FIG. 3 are denoted by the same reference numerals, and a detailed description thereof will be omitted.

Specifically, the pixel 21B has a structure common to that of the pixel 21 in FIG. 3 in that the PD 31, the first transfer transistor 32, the multiplication region 33, the FD portion 35, and the light blocking portion 46 are provided in the semiconductor substrate 41, and the color filter 42 and the on-chip lens 43 are stacked on the back surface of the semiconductor substrate 41. On the other hand, in the pixel 21B, the structure of a second transfer transistor 34B is different from the structure of the second transfer transistor 34 of the pixel 21 in FIG. 3.

As illustrated in FIG. 12, a gate electrode 45B included in the second transfer transistor 34B is larger in size than the gate electrode 45 in FIG. 3 and is formed to cover the multiplication region 33 in a wider region. Thus, in the pixel 21B, when the electric charge is transferred from the multiplication region 33 to the FD region 35, it is possible to enhance the electric field generated in the multiplication region 33 by the transfer signal TG applied to the gate electrode 45B.

The pixel 21B configured as described above enhances the electric field generated in the multiplication region 33, and so it is possible to assist multiplication of electric charge, thereby further multiplying the electric charge.

Figure 13:
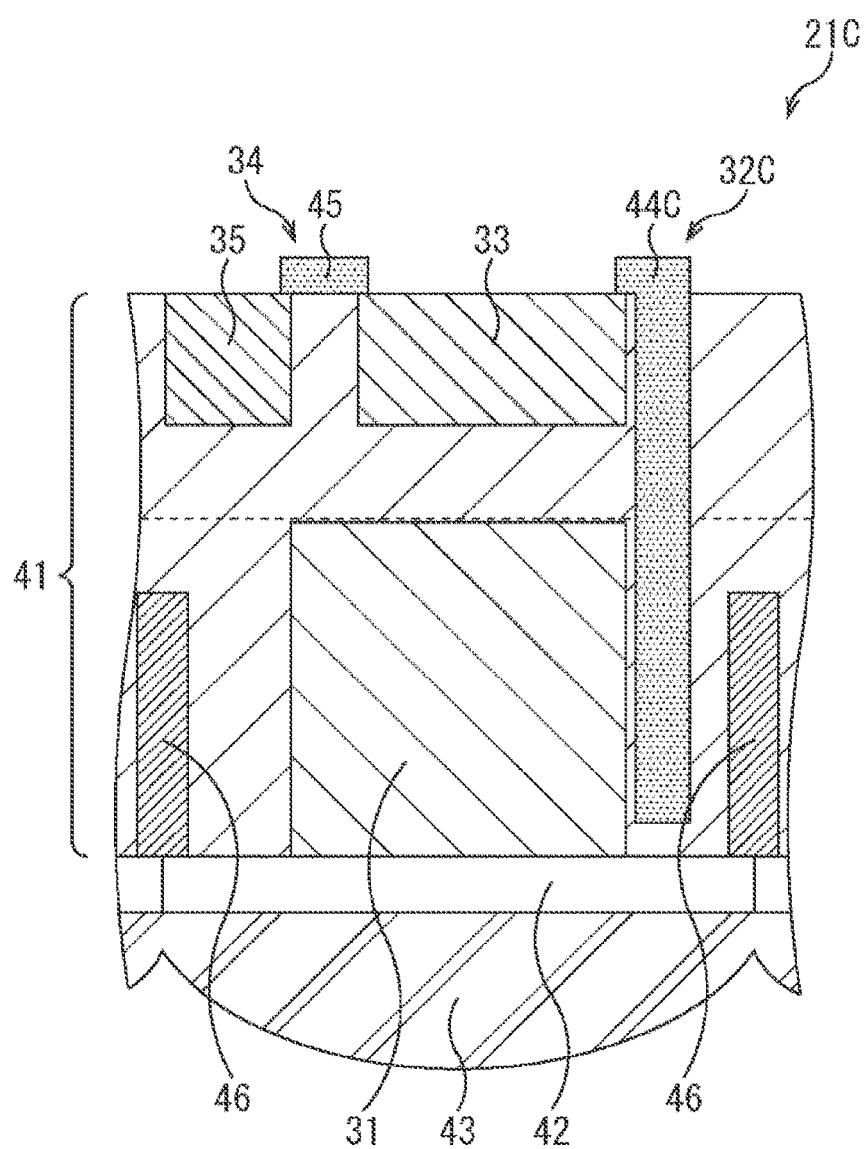
FIG. 13 is a circuit diagram illustrating a fourth configuration example of a pixel.

Next, FIG. 13 is a cross-sectional view illustrating a fourth configuration example of the pixel 21. Moreover, in a pixel 21C illustrated in FIG. 13, the components common to those of the pixel 21 in FIG. 3 are denoted by the same reference numerals, and a detailed description thereof will be omitted.

Specifically, the pixel 21C has a structure common to that of the pixel 21 in FIG. 3 in that the PD 31, the multiplication region 33, the second transfer transistor 34, the FD portion 35, and the light blocking portion 46 are provided in the semiconductor substrate 41, and the color filter 42 and the on-chip lens 43 are stacked on the back surface of the semiconductor substrate 41. On the other hand, in the pixel 21C, the structure of a first transfer transistor 32C is different from that of the first transfer transistor 32 of the pixel 21 in FIG. 3.

As illustrated in FIG. 13, a gate electrode 44C included in the first transfer transistor 32C has a length larger than that of the gate electrode 44 in FIG. 3 and is formed deep into the semiconductor substrate 41, so that more portions of the gate electrode 44C are adjacent to the PD 31. Thus, in the pixel 21C, it is possible to assist the transfer of electric charge from the PD 31 to the multiplication region 33 when the electric charge is read out from the PD 31 to the multiplication region 33.

The pixel 21C configured as described above is capable of assisting the transfer of electric charge from the PD 31 to the multiplication region 33, thereby transferring the electric charge more satisfactorily and reading out reliably the electric charge stored in the PD 31.

Figure 14:
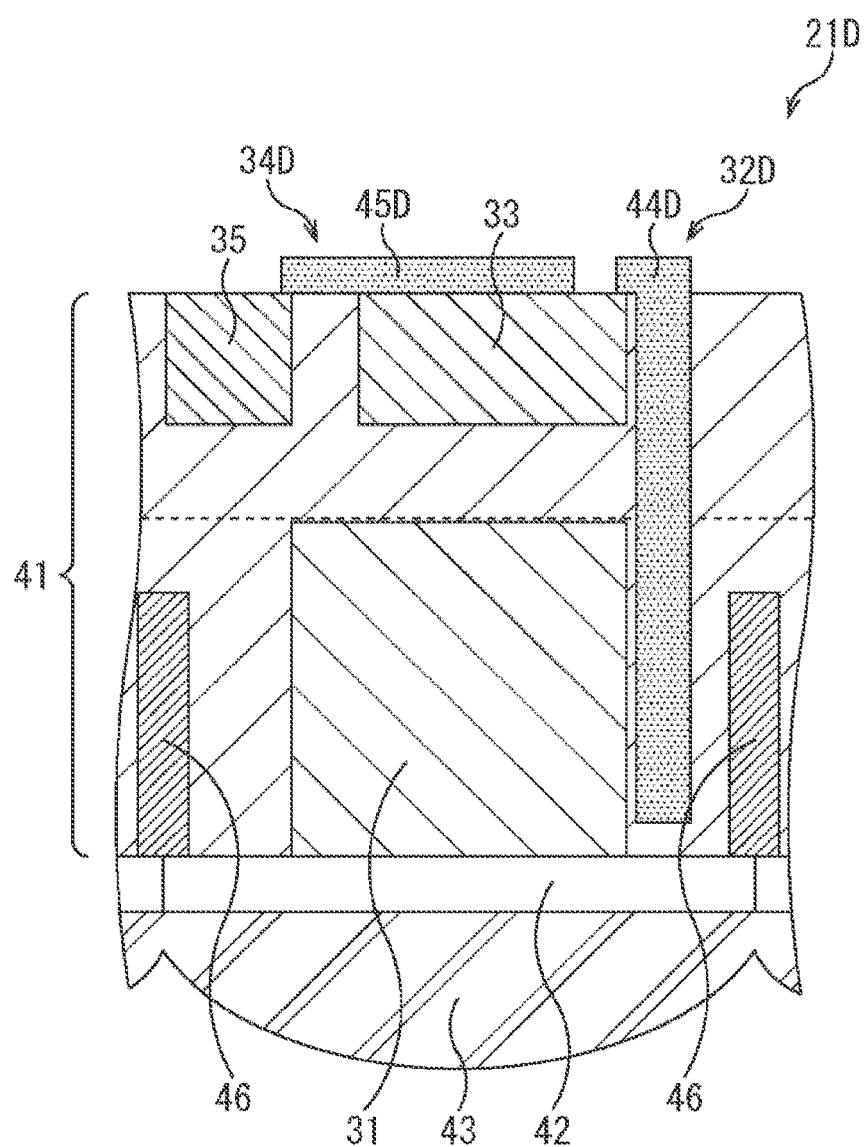
FIG. 14 is a circuit diagram illustrating a fifth configuration example of a pixel.

Next, FIG. 14 is a cross-sectional view illustrating a fifth configuration example of the pixel 21. Moreover, in a pixel 21D illustrated in FIG. 14, the components common to those of the pixel 21 in FIG. 3 are denoted by the same reference numerals, and a detailed description thereof will be omitted.

Specifically, the pixel 21D has a structure common to that of the pixel 21 in FIG. 3 in that the PD 31, the multiplication region 33, the FD portion 35, and the light blocking portion 46 are provided in the semiconductor substrate 41, and the color filter 42 and the on-chip lens 43 are stacked on the back surface of the semiconductor substrate 41. On the other hand, in the pixel 21D, the structures of a first transfer transistor 32D and a second transfer transistor 34D are different from those of the first transfer transistor 32 and the second transfer transistor 34 of the pixel 21 in FIG. 3, respectively.

As illustrated in FIG. 14, a gate electrode 44D included in the first transfer transistor 32D has a length larger than that of the gate electrode 45 in FIG. 3, which is similar to the gate electrode 45C in FIG. 13, and is formed so that more portions of the gate electrode 44D are adjacent to the PD 31. In addition, a gate electrode 45D included in the second transfer transistor 34D is larger in size than the gate electrode 45 in FIG. 3, which is similar to the gate electrode 45B in FIG. 12, and is formed to cover the multiplication region 33 in a wider region.

The pixel 21D configured as described above is capable of further multiplying electric charge, which is similar to the pixel 21B in FIG. 12, and is capable of reliably reading out the electric charge stored in the PD 31, which is similar to the pixel 21C in FIG. 13.

Figure 15:
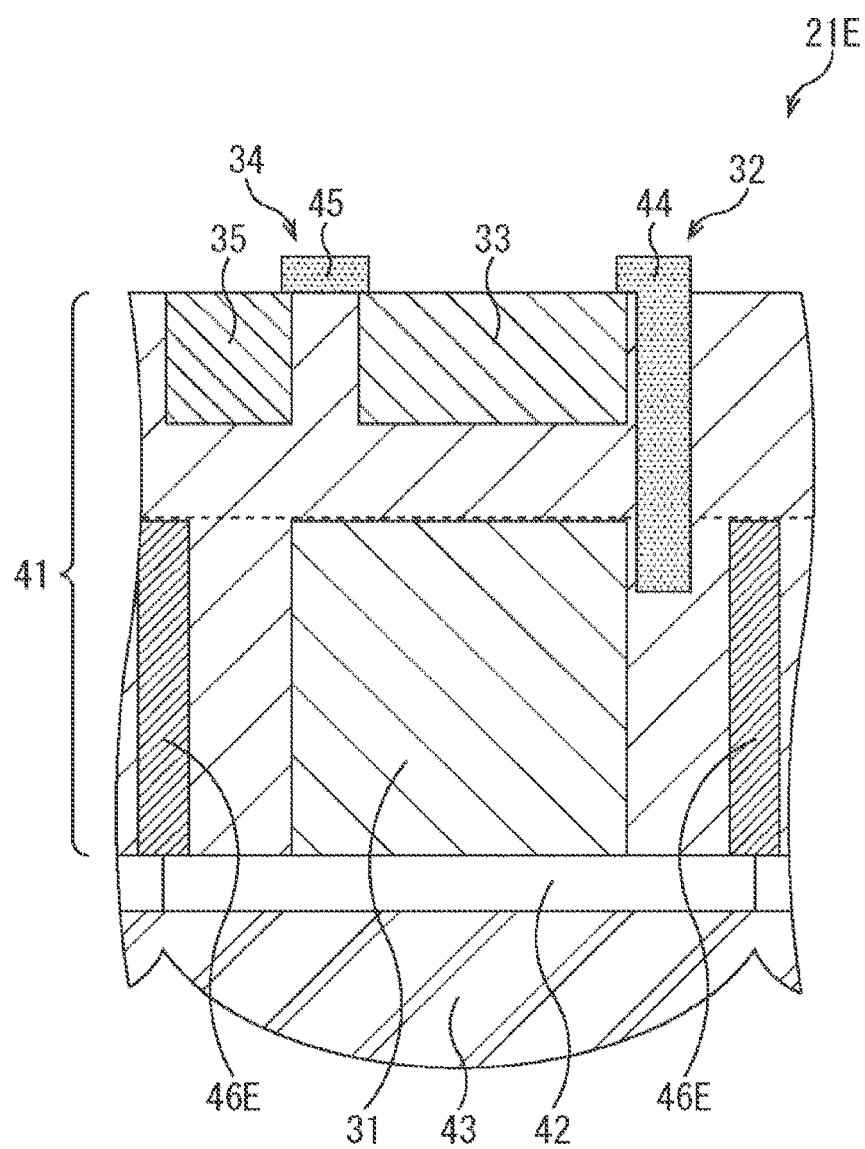
FIG. 15 is a circuit diagram illustrating a sixth configuration example of a pixel.

Next, FIG. 15 is a cross-sectional view illustrating a sixth configuration example of the pixel 21. Moreover, in a pixel 21E illustrated in FIG. 15, the components common to those of the pixel 21 in FIG. 3 are denoted by the same reference numerals, and a detailed description thereof will be omitted.

Specifically, the pixel 21E has a structure common to the pixel 21 in FIG. 3 in that the PD 31, the first transfer transistor 32, the multiplication region 33, the second transfer transistor 34, and the FD portion 35 are provided in the semiconductor substrate 41, and the color filter 42 and the on-chip lens 43 are stacked on the back surface of the semiconductor substrate 41. On the other hand, in the pixel 21E, the structure of a light blocking portion 46E is different from that of the light blocking portion 46 of the pixel 21 in FIG. 3.

As illustrated in FIG. 15, the light blocking portion 46E included in the pixel 21E has a length larger than that of the light blocking portion 46 in FIG. 3, and is formed to have substantially the same depth as the depth from the back surface of the semiconductor substrate 41 to the region where the PD 31 is formed. In one example, as described above with reference to FIG. 10, in the structure in which the first semiconductor substrate 41-1 where the PD 31 is formed and the first semiconductor substrate 41-2 where the multiplication region 33 is formed are bonded to each other, the light blocking portion 46E is formed to have substantially the same depth as the thickness of the first semiconductor substrate 41-1.

In the pixel 21E formed as described above, the light blocking portion 46E reliably blocks light incident on each of the adjacent pixels 21, and so, in one example, it is possible to prevent light from entering the multiplication region 33 from other adjacent pixels 21. This makes it possible for the pixel 21E to prevent occurrence of color mixture (parasitic light sensitivity: PLS) or the like in the multiplication region 33.

Figure 16:
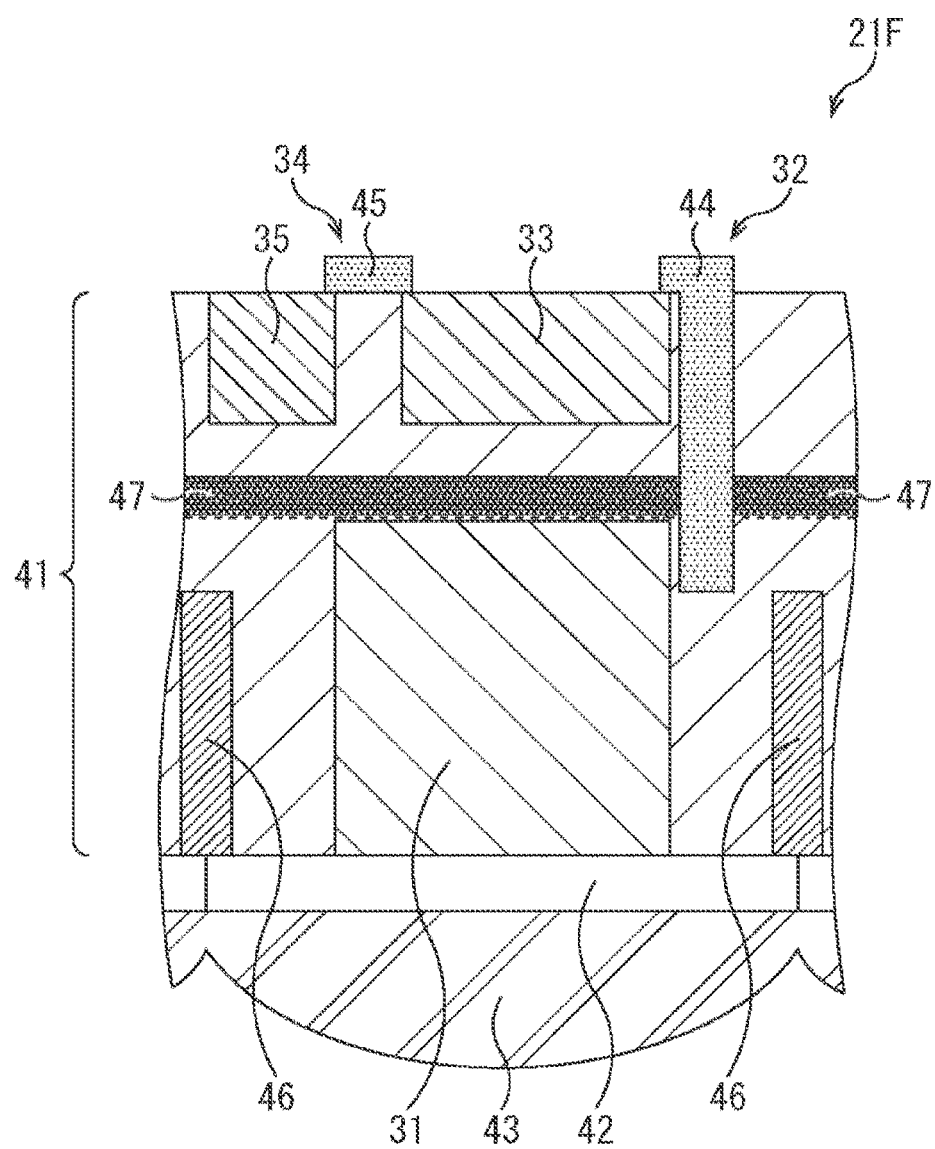
FIG. 16 is a circuit diagram illustrating a seventh configuration example of a pixel.

Next, FIG. 16 is a cross-sectional view illustrating a seventh configuration example of the pixel 21. Moreover, in a pixel 21F illustrated in FIG. 16, the components common to those of the pixel 21 in FIG. 3 are denoted by the same reference numerals, and a detailed description thereof will be omitted.

Specifically, the pixel 21F has a structure common to the pixel 21 in FIG. 3 in that the PD 31, the first transfer transistor 32, the multiplication region 33, the second transfer transistor 34, the FD portion 35, and the light blocking portion 46 are provided in the semiconductor substrate 41, and the color filter 42 and the on-chip lens 43 are stacked on the back surface of the semiconductor substrate 41. On the other hand, the pixel 21F is different in configuration from the pixel 21 in FIG. 3 in that it includes a light blocking film 47.

As illustrated in FIG. 16, the pixel 21F has the light blocking film 47 equipped with light blocking characteristics, which is provided between the multiplication region 33 and the layer provided with the PD 31. Such a light blocking structure makes it possible for the pixel 21F to prevent light emitting from the back surface side of the semiconductor substrate 41 from reaching the multiplication region 33 through the semiconductor substrate 41.

In the pixel 21F configured as described above, the light blocking film 47 is capable of reliably blocking the light transmitted through the semiconductor substrate 41 from reaching the multiplication region 33, thereby preventing, in one example, occurrence of color mixture (parasitic light sensitivity: PLS) or the like in the multiplication region 33.

Moreover, in one example, the light blocking portion 46E included in the pixel 21E in FIG. 15 and the light blocking film 47 included in the pixel 21F in FIG. 16 may be combined, and both the light blocking portion 46E and the light blocking film 47 can prevent occurrence of color mixture or the like in the multiplication region 33 more reliably.

Figure 17:
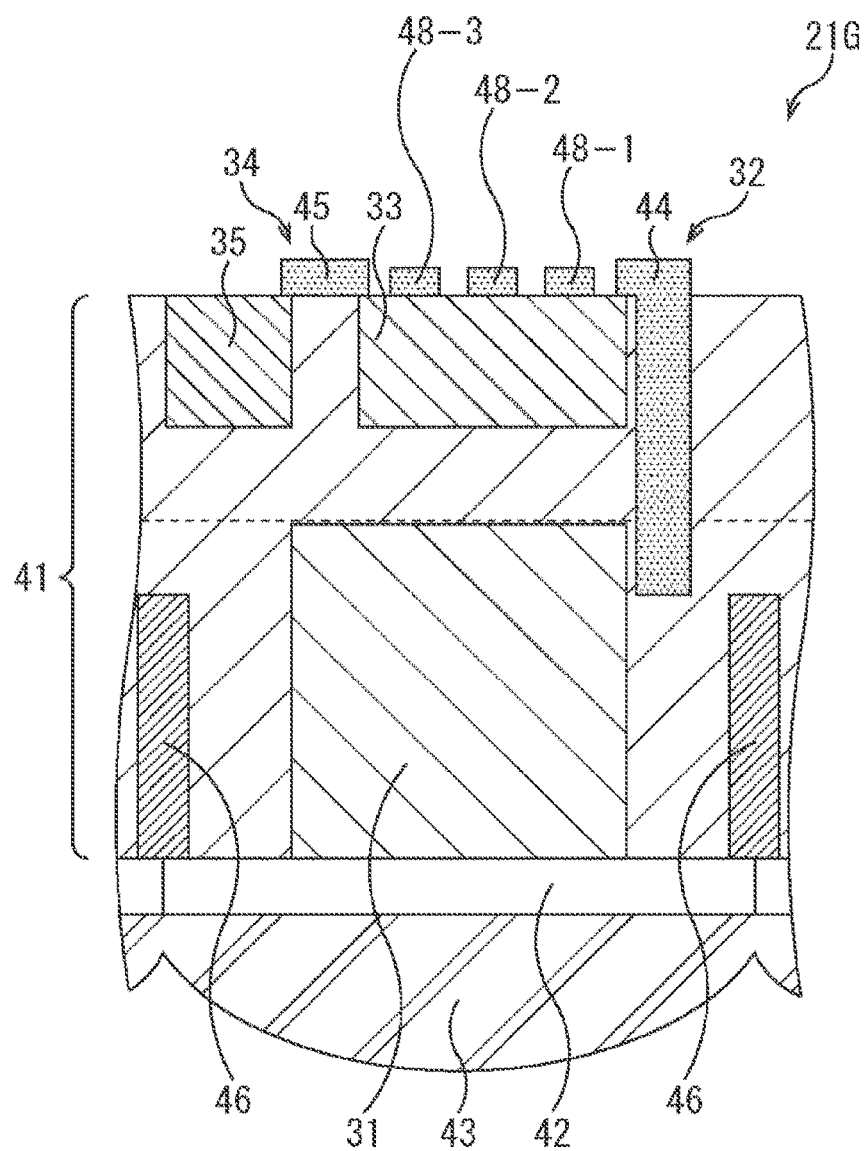
FIG. 17 is a circuit diagram illustrating an eighth configuration example of a pixel.

Next, FIG. 17 is a cross-sectional view illustrating an eighth configuration example of the pixel 21. Moreover, in a pixel 21G illustrated in FIG. 17, the components common to those of the pixel 21 in FIG. 3 are denoted by the same reference numerals, and a detailed description thereof will be omitted.

Specifically, the pixel 21G has a structure common to that of the pixel 21 in FIG. 3 in that the PD 31, the first transfer transistor 32, the multiplication region 33, the second transfer transistor 34, the FD portion 35, and the light blocking portion 46 are provided in the semiconductor substrate 41, and the color filter 42 and the on-chip lens 43 are stacked on the back surface of the semiconductor substrate 41. On the other hand, the pixel 21G is different from the pixel 21 in FIG. 3 in that it includes multiplication gate electrodes 48-1 to 48-3.

As illustrated in FIG. 17, the pixel 21G has a configuration in which multiplication gate electrodes 48-1 to 48-3 are stacked on the front surface of the multiplication region 33 in the semiconductor substrate 41. The multiplication gate electrodes 48-1 to 48-3 are arranged to be aligned with one another from the first transfer transistor 32 toward the second transfer transistor 34.

As described above, it is possible to generate an intense electric field region by applying an optional bias voltage to the multiplication gate electrodes 48-1 to 48-3 arranged in the multiplication region 33, which leads to an avalanche effect, thereby amplifying electrons. Then, the electrons amplified in the multiplication region 33 are transferred to the FD portion 35 through the second transfer transistor 34.

The pixel 21G formed as described above enhances the electric field generated in the multiplication region 33, and so it is possible to assist multiplication of electric charge, thereby further multiplying electric charge.

Moreover, the number of the multiplication gate electrodes 48 illustrated in FIG. 17, the bias voltage to be applied to the multiplication gate electrode 48, or the like is optionally specified depending on the extent to which electrons are multiplied in the multiplication region 33.

Figure 18:
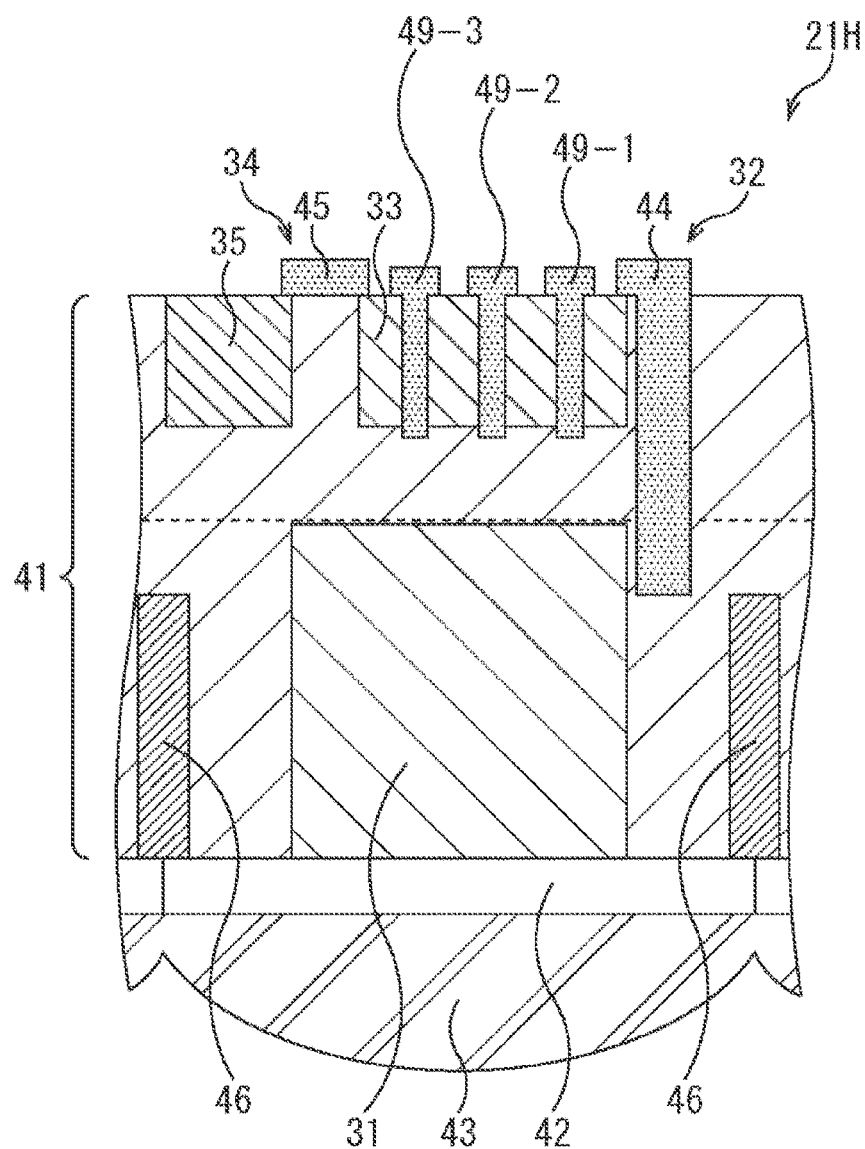
FIG. 18 is a circuit diagram illustrating a ninth configuration example of a pixel.

Next, FIG. 18 is a cross-sectional view illustrating a ninth configuration example of the pixel 21. Moreover, in a pixel 21H illustrated in FIG. 18, the components common to those of the pixel 21 in FIG. 3 are denoted by the same reference numerals, and a detailed description thereof will be omitted.

Specifically, the pixel 21H has a structure common to the pixel 21 in FIG. 3 in that the PD 31, the first transfer transistor 32, the multiplication region 33, the second transfer transistor 34, the FD portion 35, and the light blocking portion 46 are provided in the semiconductor substrate 41, and the color filter 42 and the on-chip lens 43 are stacked on the back surface of the semiconductor substrate 41. On the other hand, the pixel 21H is different from the pixel 21 in FIG. 3 in that it includes multiplication gate electrodes 49-1 to 49-3.

As illustrated in FIG. 18, the pixel 21H has a configuration in which the multiplication gate electrodes 49-1 to 49-3 are embedded in the semiconductor substrate 41 so that they penetrate the multiplication region 33 from the front surface of the multiplication region 33 in the semiconductor substrate 41. The multiplication gate electrodes 49-1 to 49-3 are arranged to be aligned with one another from the first transfer transistor 32 toward the second transfer transistor 34.

As described above, it is possible to generate an intense electric field region by applying an optional bias voltage to the multiplication gate electrodes 49-1 to 49-3 arranged in the multiplication region 33, which leads to an avalanche effect, thereby amplifying electrons. Then, the electrons amplified in the multiplication region 33 are transferred to the FD portion 35 through the second transfer transistor 34.

The pixel 21H formed as described above enhances the electric field generated in the multiplication region 33 and so it is possible to assist the multiplication of electric charge, thereby further multiplying electric charge.

Moreover, the number of the multiplication gate electrodes 49 illustrated in FIG. 18, the bias voltage to be applied to the multiplication gate electrode 49, or the like is optionally specified depending on the extent to which electrons are multiplied in the multiplication region 33. In addition, the multiplication gate electrode 48 illustrated in FIG. 17 and the multiplication gate electrode 49 illustrated in FIG. 18 may be arranged in such a way that they are combined.

Figure 19:
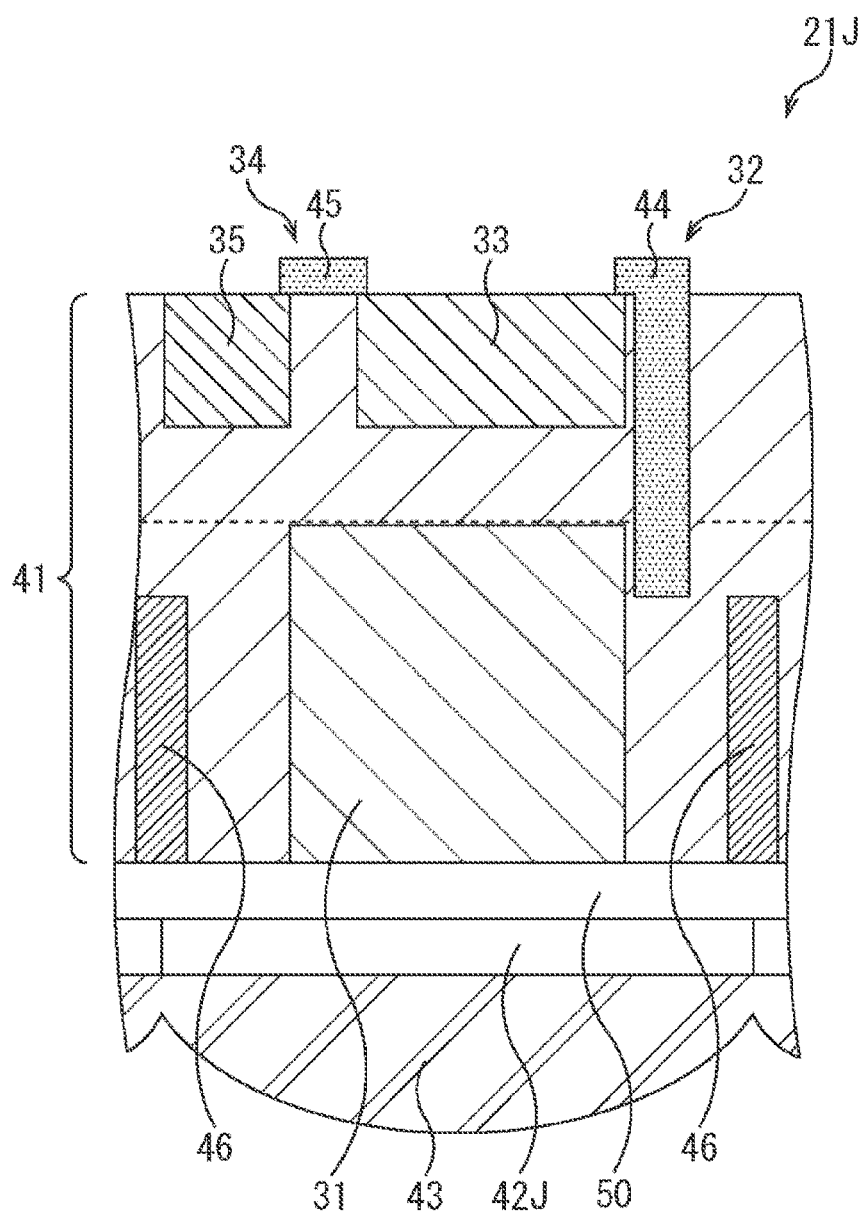
FIG. 19 is a circuit diagram illustrating a tenth configuration example of a pixel.

Next, FIG. 19 is a cross-sectional view illustrating a tenth configuration example of the pixel 21. Moreover, in a pixel 21J illustrated in FIG. 19, the components common to those of the pixel 21 in FIG. 3 are denoted by the same reference numerals, and a detailed description thereof will be omitted.

Specifically, the pixel 21J has a structure common to the pixel 21 in FIG. 3 in that the PD 31, the first transfer transistor 32, the multiplication region 33, the second transfer transistor 34, the FD portion 35, and the light blocking portion 46 are provided in the semiconductor substrate 41. On the other hand, the pixel 21J has a different structure from the pixel 21 in FIG. 3 in that an on-chip lens 43 is stacked on the back surface of the semiconductor substrate 41 through an organic film 50 and a color filter 42J.

In one example, in the pixel 21J, a color filter that transmits yellow or cyan light is used as the color filter 42J, and an organic film that has sensitivity to light of a specific wavelength component, for example, green light is used as the organic film 50. Specifically, in the pixel 21J in which the color filter 42J that transmits yellow light is used, among light transmitted through the color filter 42J, the green light is photoelectrically converted by the organic film 50 and the red light transmitted through the organic film 50 is photoelectrically converted by the PD 31. In addition, in the pixel 21J in which the color filter 42J that transmits cyan light is used, among light transmitted through the color filter 42J, the green light is photoelectrically converted by the organic film 50 and the blue light is photoelectrically converted by the PD 31. As described above, in one example, only the PD 31 performs the photoelectric conversion in the pixel 21 in FIG. 3, whereas both the organic film 50 and the PD 31 perform the photoelectric conversion in the pixel 21J.

The pixel 21J configured as described above is capable of multiplying electrons generated by the red and blue light photoelectrically converted by the PD 31 in the multiplication region 33, thereby enhancing the sensitivity of red and blue to a level comparable to the sensitivity of green that is photoelectrically converted in the organic film 50.

Figure 20:
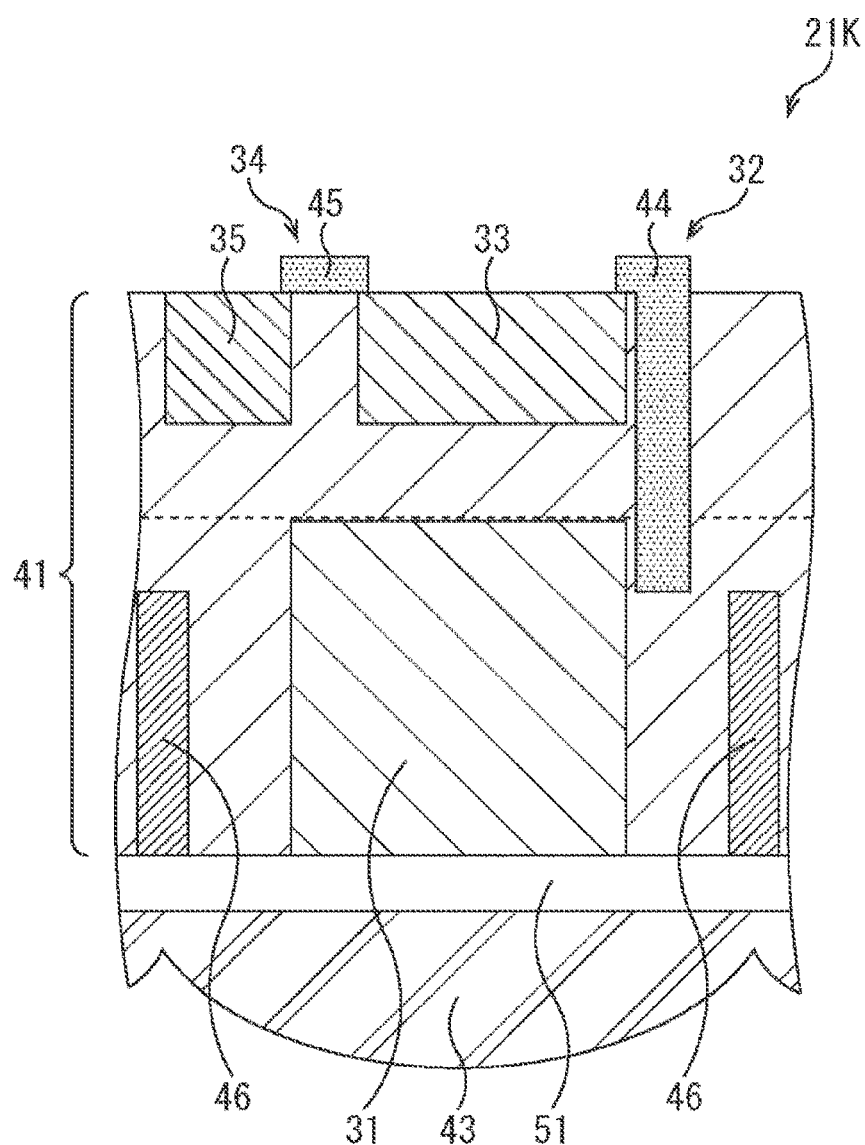
FIG. 20 is a circuit diagram illustrating an eleventh configuration example of a pixel.

Next, FIG. 20 is a cross-sectional view illustrating an eleventh configuration example of the pixel 21. Moreover, in a pixel 21K illustrated in FIG. 20, the components common to those of the pixel 21 in FIG. 3 are denoted by the same reference numerals, and a detailed description thereof will be omitted.

Specifically, the pixel 21K has a structure common to the pixel 21 in FIG. 3 in that the PD 31, the first transfer transistor 32, the multiplication region 33, the second transfer transistor 34, the FD portion 35, and the light blocking portion 46 are provided in the semiconductor substrate 41. On the other hand, the pixel 21K has a different structure from the pixel 21 in FIG. 3 in that the on-chip lens 43 is stacked on the back surface of the semiconductor substrate 41 through an inorganic film 51.

In one example, in the pixel 21K, it is possible to photoelectrically convert a specific wavelength component by the inorganic film 51 and to photoelectrically convert other wavelength components by the PD 31. In one example, the use of an inorganic film having sensitivity to infrared light as the inorganic film 51 makes it possible for the pixel 21K to have a structure in which, among light incident on the pixel 21K, infrared light is photoelectrically converted by the inorganic film 51, but light of other wavelength components are photoelectrically converted by the PD 31. This makes it possible to use, in one example, the inorganic film 51 as an infrared light cut filter. As described above, in one example, only the PD 31 performs the photoelectric conversion in the pixel 21 in FIG. 3, whereas the photoelectric conversion is performed in both the organic film 50 and the PD 31 in the pixel 21K.

The pixel 21K configured as described above is capable of reading out the electric charge, which is generated by photoelectric conversion of components other than a specific wavelength component by the PD 31, through the multiplication region 33.

Figure 21:
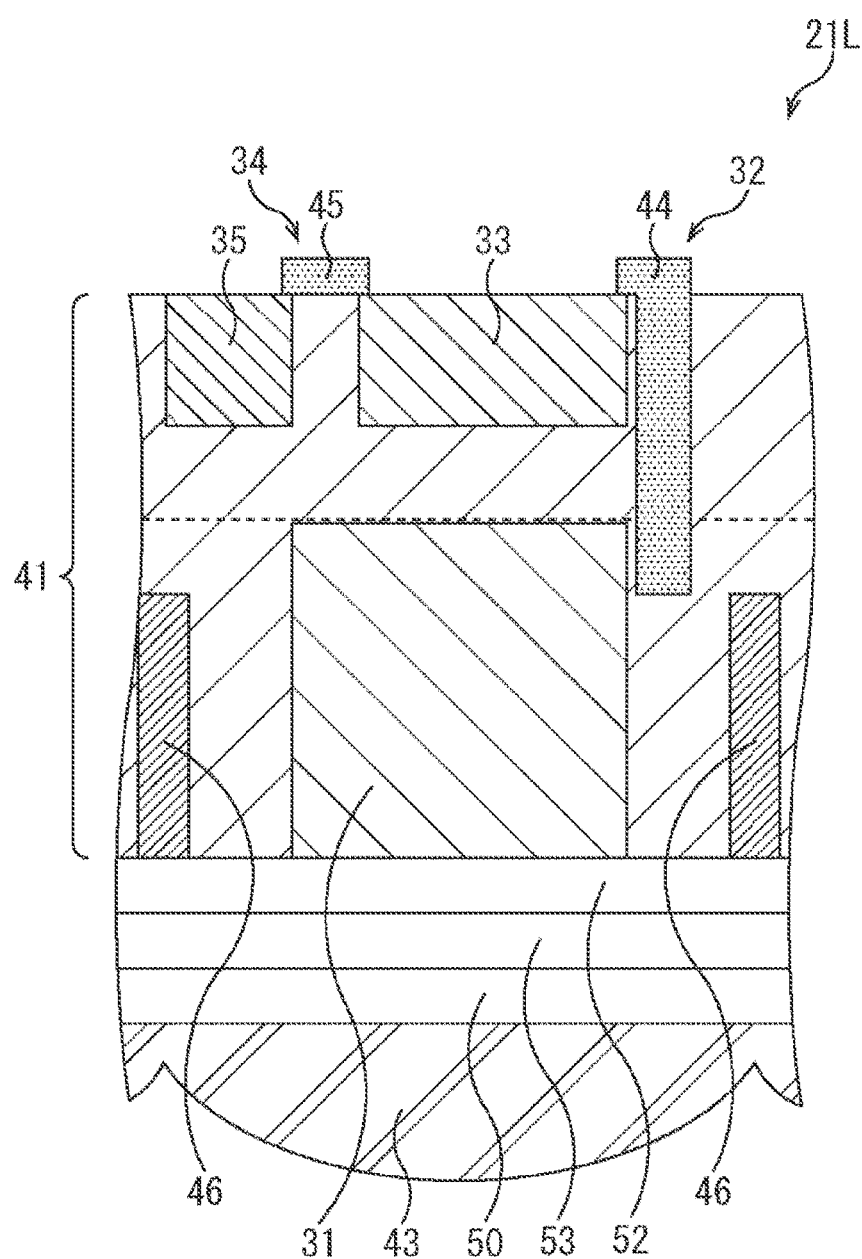
FIG. 21 is a circuit diagram illustrating a twelfth configuration example of a pixel.

Next, FIG. 21 is a cross-sectional view illustrating a twelfth configuration example of the pixel 21. Moreover, in a pixel 21L illustrated in FIG. 21, the components common to those of the pixel 21 in FIG. 3 are denoted by the same reference numerals, and a detailed description thereof will be omitted.

Specifically, the pixel 21L has a structure common to the pixel 21 in FIG. 3 in that the PD 31, the first transfer transistor 32, the multiplication region 33, the second transfer transistor 34, the FD portion 35, and the light blocking portion 46 are provided in the semiconductor substrate 41. On the other hand, the pixel 21L has a different structure from the pixel 21 in FIG. 3 in that the on-chip lens 43 is stacked on the back surface of the semiconductor substrate 41 through an organic film 52, an organic film 53, and the organic film 50.

In one example, in the pixel 21L, an organic film that has sensitivity to blue light is used as the organic film 52, and an organic film that has sensitivity red light is used as the organic film 52. In addition, as described above with reference to FIG. 19, an organic film that has sensitivity to green light is used as the organic film 50.

In one example, in the pixel 21L, blue, red, and green light are photoelectrically converted by the organic film 52, the organic film 53, and the organic film 50, respectively, and the infrared light transmitted through the organic film 52, the organic film 53, and the organic film 50 is photoelectrically converted by the PD 31.

The pixel 21L configured as described above is capable of achieving high sensitivity characteristics for all of blue, red, green, and infrared light.

Figure 22:
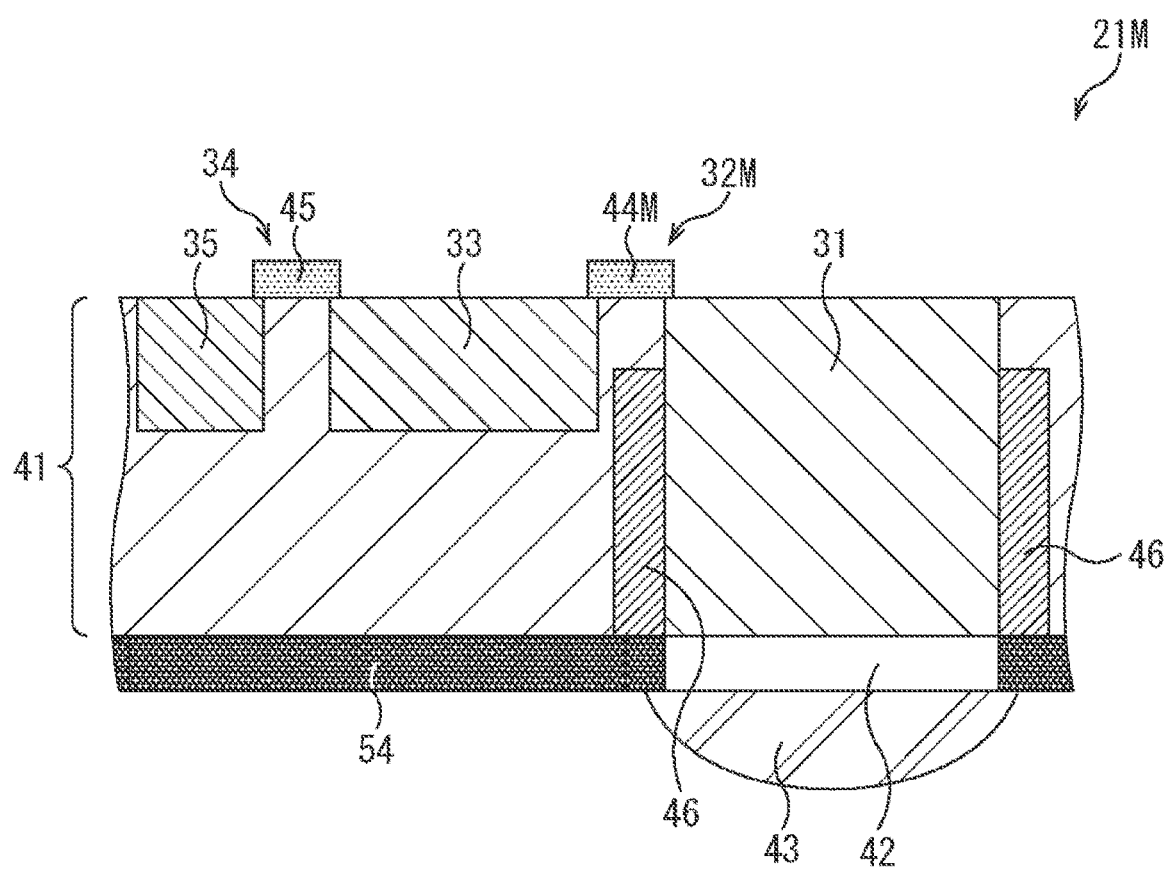
FIG. 22 is a circuit diagram illustrating a thirteenth configuration example of a pixel.

Next, FIG. 22 is a cross-sectional view illustrating a thirteenth configuration example of the pixel 21. Moreover, in a pixel 21M illustrated in FIG. 22, the components common to those of the pixel 21 in FIG. 3 are denoted by the same reference numerals, and a detailed description thereof will be omitted.

Specifically, the pixel 21 in FIG. 3 has the arrangement configuration in which the PD 31 and the multiplication region 33 are provided in a stacked configuration, whereas the pixel 21M has an arrangement configuration in which the PD 31 and the multiplication region 33 are provided in the same layer without being stacked as illustrated in FIG. 22, which is different from the pixel 21 in FIG. 3.

More specifically, the pixel 21M has a configuration in which the PD 31 and the multiplication region 33 are arranged to be aligned in the same layer of the semiconductor substrate 41, and a gate electrode 44M of a first transfer transistor 32M is stacked on the front surface of the semiconductor substrate 41 between the PD 31 and the multiplication region 33. In addition, a light blocking film 54 is stacked on a region other than the region where the PD 31 is provided on the back surface of the semiconductor substrate 41 so that the incidence of light to other components than the PD 31 is blocked.

The pixel 21M configured as described above is capable of multiplying the electric charge generated in the PD 31 by reading out it through the multiplication region 33, which is similar to the pixel 21 having the configuration in which the PD 31 and the multiplication region 33 are stacked on each other. This makes it possible for the pixel 21M to obtain a pixel signal with high sensitivity, in one example, even at low illuminance.

Then, the image sensor 11 including the pixel 21M can employ a structure similar to that of the CMOS image sensor in related art with respect to the photoelectric conversion characteristics in the PD 31 or the electric-charge transfer conversion characteristics from the PD 31. Furthermore, in the image sensor 11, the number of transistors necessary for the pixel 21 can be made smaller than that of the APD in related art, and so it is possible to achieve size reduction of the pixel 21M, thereby being configured with the higher integration and being provided with the multiplication function.

Figure 23:
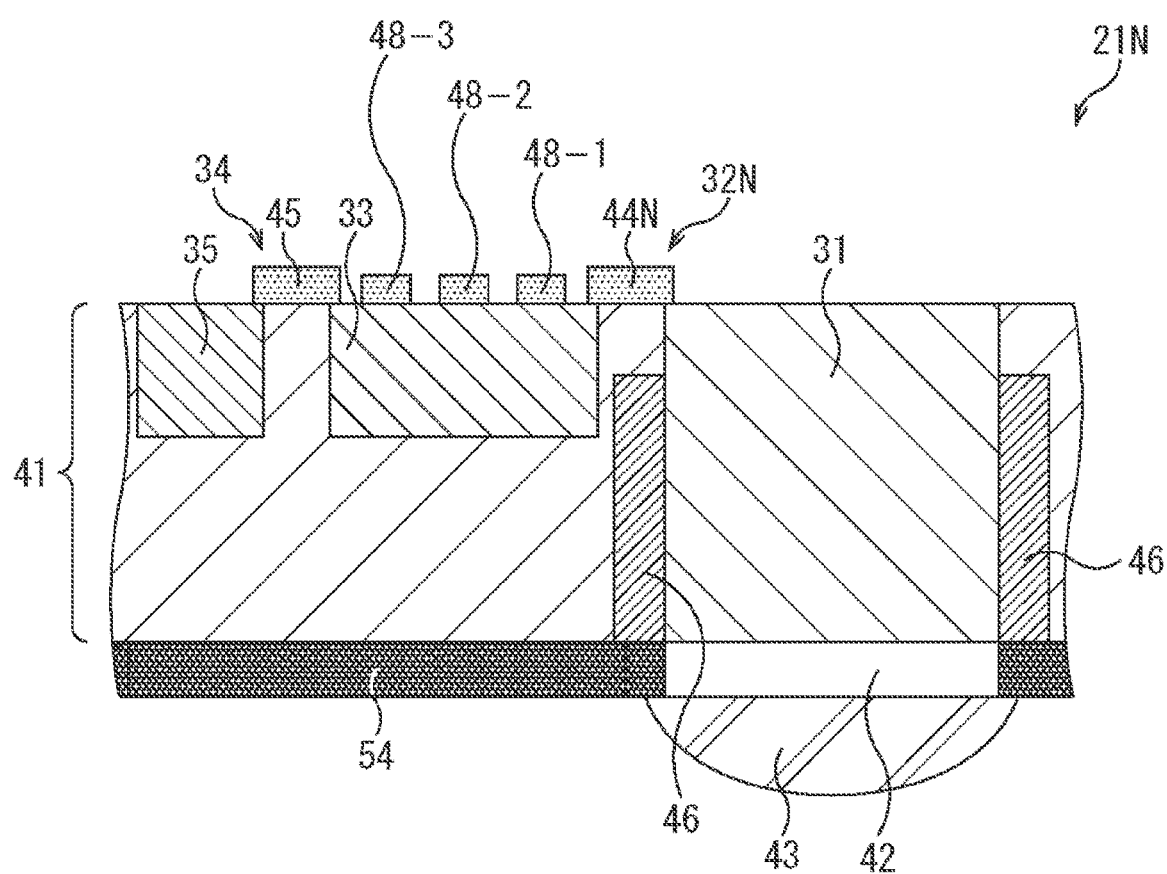
FIG. 23 is a circuit diagram illustrating a fourteenth configuration example of a pixel.

Next, FIG. 23 is a cross-sectional view illustrating a fourteenth configuration example of the pixel 21. Moreover, in a pixel 21N illustrated in FIG. 23, the components common to those of the pixel 21M in FIG. 22 are denoted by the same reference numerals, and a detailed description thereof will be omitted.

Specifically, the pixel 21N has an arrangement configuration in which the PD 31 and the multiplication region 33 are provided in the same layer without being stacked, which is similar to the pixel 21M in FIG. 22. On the other hand, the pixel 21N is different in configuration from the pixel 21M in FIG. 22 in that it includes the multiplication gate electrodes 48-1 to 48-3.

Specifically, the pixel 21N uses the multiplication gate electrodes 48-1 to 48-3 to enhance the electric field generated in the multiplication region 33, and so it is possible to assist the multiplication of electric charge, thereby further multiplying electric charge, which is similar to the pixel 21G in FIG. 17.

Figure 24:
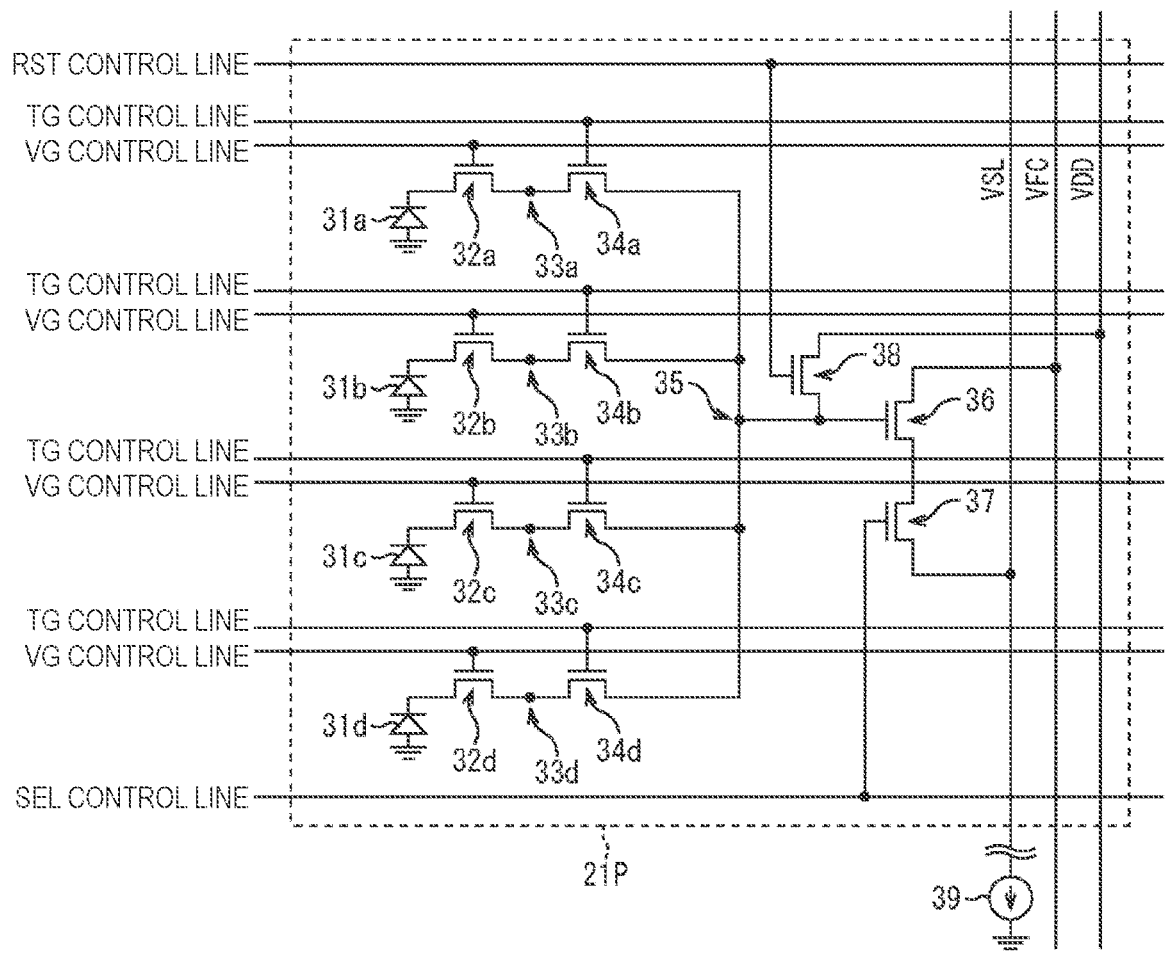
FIG. 24 is a circuit diagram illustrating a fifteenth configuration example of a pixel.

Next, FIG. 24 is a circuit diagram illustrating a fifteenth configuration example of the pixel 21. Moreover, in a pixel 21P illustrated in FIG. 24, the components common to those of the pixel 21 in FIG. 2 are denoted by the same reference numerals, and a detailed description thereof will be omitted.

Specifically, the pixel 21P has a so-called 4-pixel sharing structure in which four PDs 31a to 31d share a pixel circuit including the FD portion 35, the amplification transistor 36, the selection transistor 37, and the reset transistor 38.

In such a pixel 21P, the electric charge can be amplified in transferring the electric charge from multiplication regions 33a to 33d to the FD portion 35, and the output of the high-potential FD portion 35 can be input to the amplification transistor 36 with no change. The amplification transistor 36 is necessary to receive a high voltage as an input, and the use of a high voltage compatible transistor is necessary to have, in one example, an area larger than that of a low voltage compatible transistor.

Thus, it is possible for the pixel 21P having the 4-pixel sharing structure to reduce the number of the amplification transistors 36, thereby achieving high integration.

Figure 25:
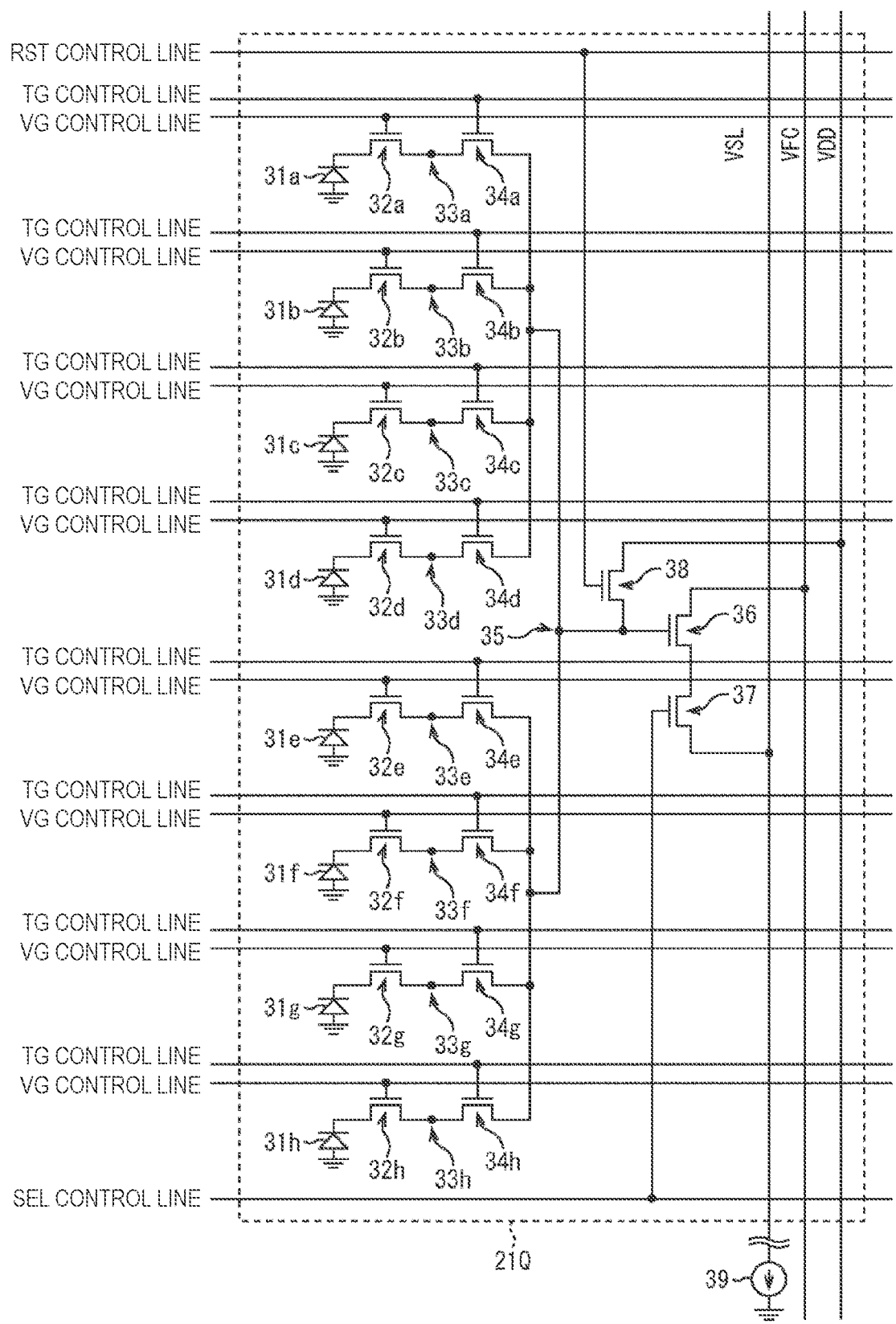
FIG. 25 is a circuit diagram illustrating a sixteenth configuration example of a pixel.

Next, FIG. 25 is a circuit diagram illustrating a sixteenth configuration example of the pixel 21. Moreover, in a pixel 21Q illustrated in FIG. 25, the components common to those of the pixel 21 in FIG. 2 are denoted by the same reference numerals, and a detailed description thereof will be omitted.

Specifically, the pixel 21Q has a so-called 8-pixel sharing structure in which eight PDs 31a to 31h share a pixel circuit including the FD portion 35, the amplification transistor 36, the selection transistor 37, and the reset transistor 38.

Thus, it is possible for the pixel 21Q having the 8-pixel sharing structure to reduce the number of the amplification transistors 36, thereby achieving further high integration, as compared to the pixel 21P having the 4-pixel sharing structure in FIG. 24.

Next, a planar layout of the pixel 21Q having the 8-pixel sharing structure will be described with reference to FIGS. 26 and 27.

Figure 26:
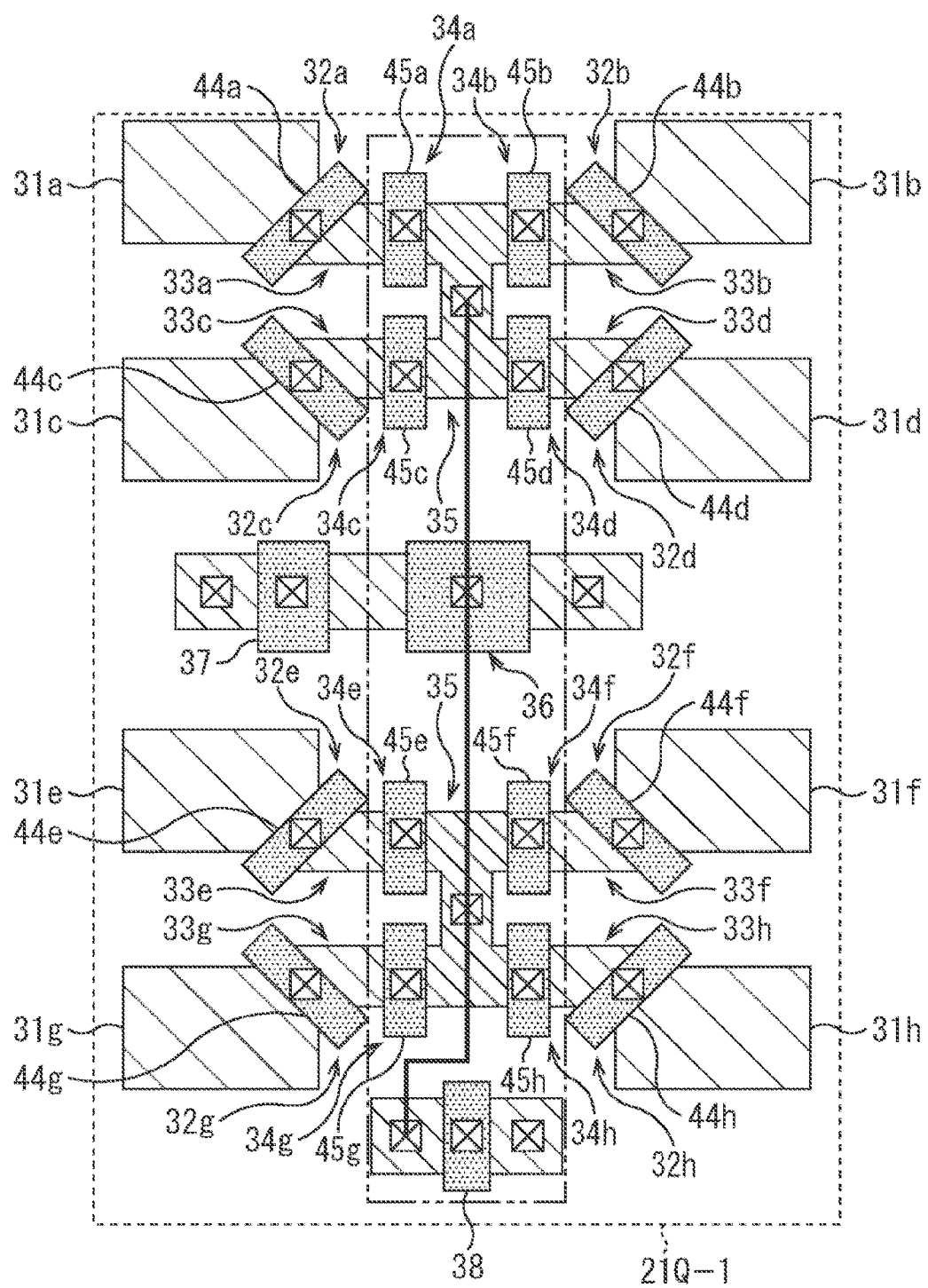
FIG. 26 is a diagram illustrating a first planar layout example of a pixel having an 8-pixel sharing structure.

FIG. 26 illustrates a planar layout example of the pixel 21Q having the 8-pixel sharing structure, in one example, in the arrangement configuration in which the PD 31 and the multiplication region 33 are not stacked as illustrated in FIG. 22. In addition, FIG. 27 illustrates a planar layout example of the pixel 21Q having the 8-pixel sharing structure, in one example, in the arrangement configuration in which the PD 31 and the multiplication region 33 are stacked as illustrated in FIG. 3.

Figure 27:
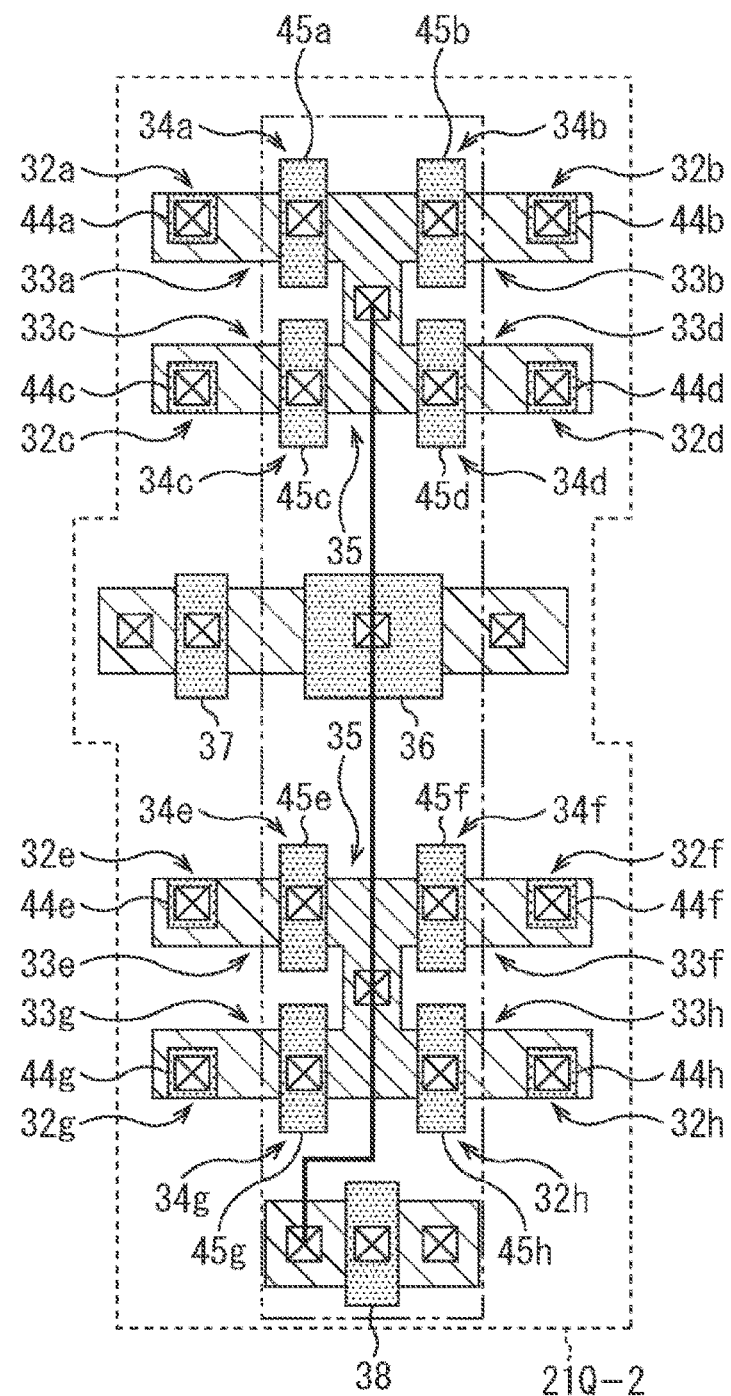
FIG. 27 is a diagram illustrating a second planar layout example of a pixel having an 8-pixel sharing structure.

As illustrated in FIGS. 26 and 27, when the eight PDs 31a to 31h are arranged so that the lateral direction×longitudinal direction is 2×4, it is possible to group regions where the second transfer transistor 34 that applies a high voltage for the multiplication of electric charge is arranged (region surrounded by a two-dot chain line) together. This makes it possible for the second transfer transistor 34 to be separated from a region where a transistor for applying the voltage for normal operation is arranged.

Thus, it is possible to reduce the region for separating transistors having different voltages from each other, in one example, as compared to a configuration in which a transistor for high voltage and a transistor for low voltage are arranged to be mixed, and so the pixel 21 Q having such a layout can achieve higher integration.

The amplification of electric charge in transferring the electric charge from the multiplication region 33 to the FD portion 35 by using the second transfer transistor 34 is now described with reference to FIGS. 28 to 30.

Figure 28:
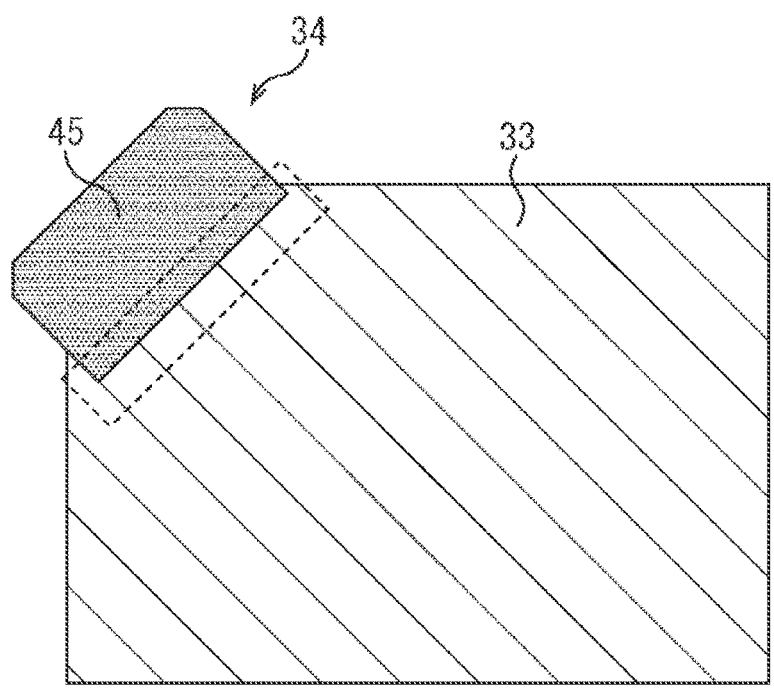
FIG. 28 is a diagram illustrating a layout of a multiplication region and a second transfer transistor as viewed in planar view.

FIG. 28 illustrates a layout of the multiplication region 33 and the second transfer transistor 34 as viewed in planar view.

In one example, when the transfer signal TG supplied to the second transfer transistor 34 is turned on, an intense electric field of the order that may cause an increase of electrons due to the avalanche effect, that is, an electric field of about 5.5E+5 [V/cm] at the maximum occurs near the edge of the gate electrode 45 indicated by a broken line in FIG. 28.

Figure 29:
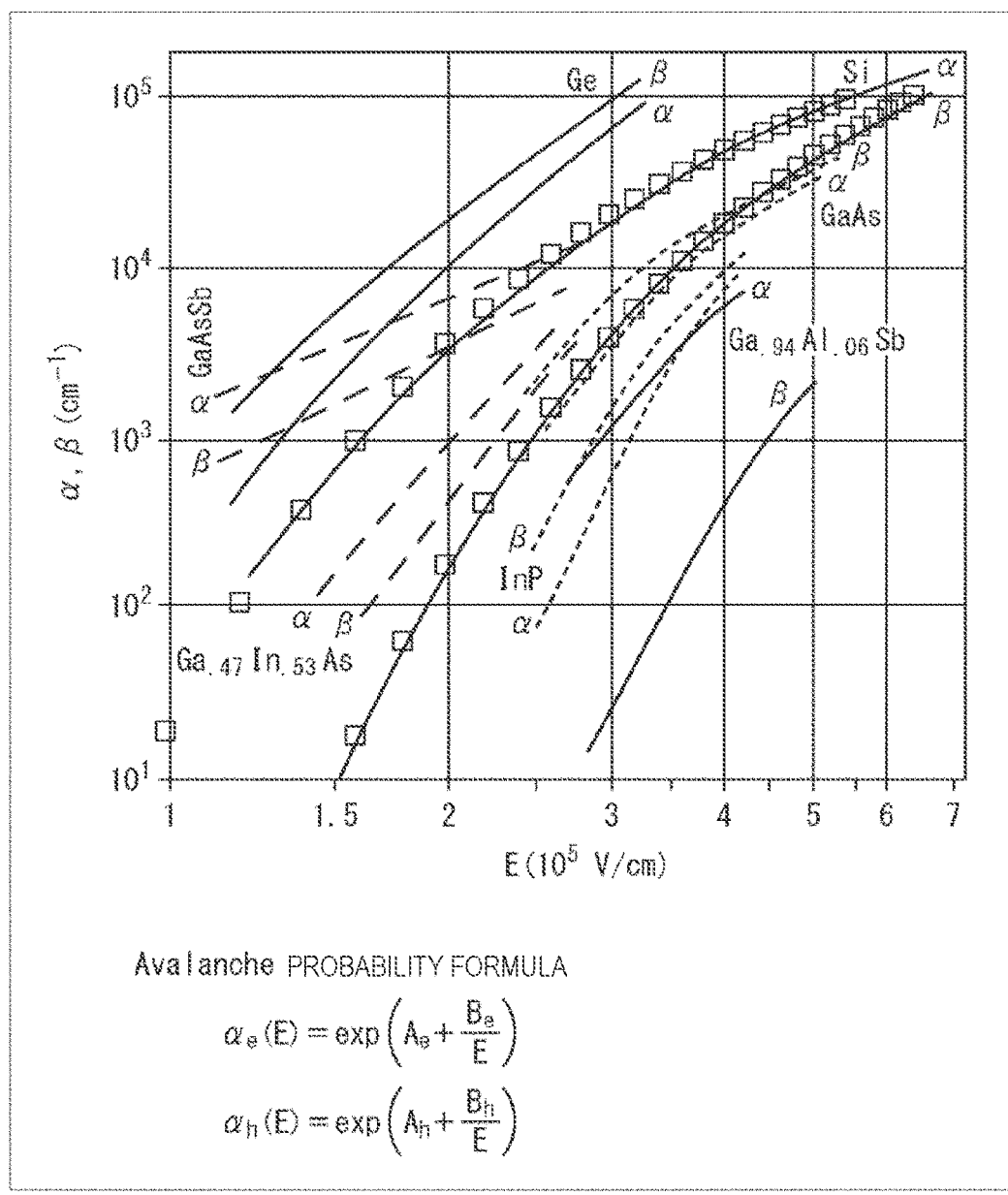
FIG. 29 is a diagram illustrated to describe an impact ionization probability.

In addition, FIG. 29 shows the impact ionization probability (avalanche probability) for various semiconductor materials, where the horizontal axis represents the electric field [$10^5$ V/cm] and the vertical axis represents the impact ionization probability [$cm^{-1}$]. Here, in FIG. 29, in the avalanche probability formula, $A_e$=1.34×10, $A_h$=1.44×10, $B_e$=−1.05×$10^6$ V/cm, and $B_h$=−1.85×$10^6$ V/cm, and the impact ionization probabilities to which the fine adjustment has been made are plotted.

Figure 30:
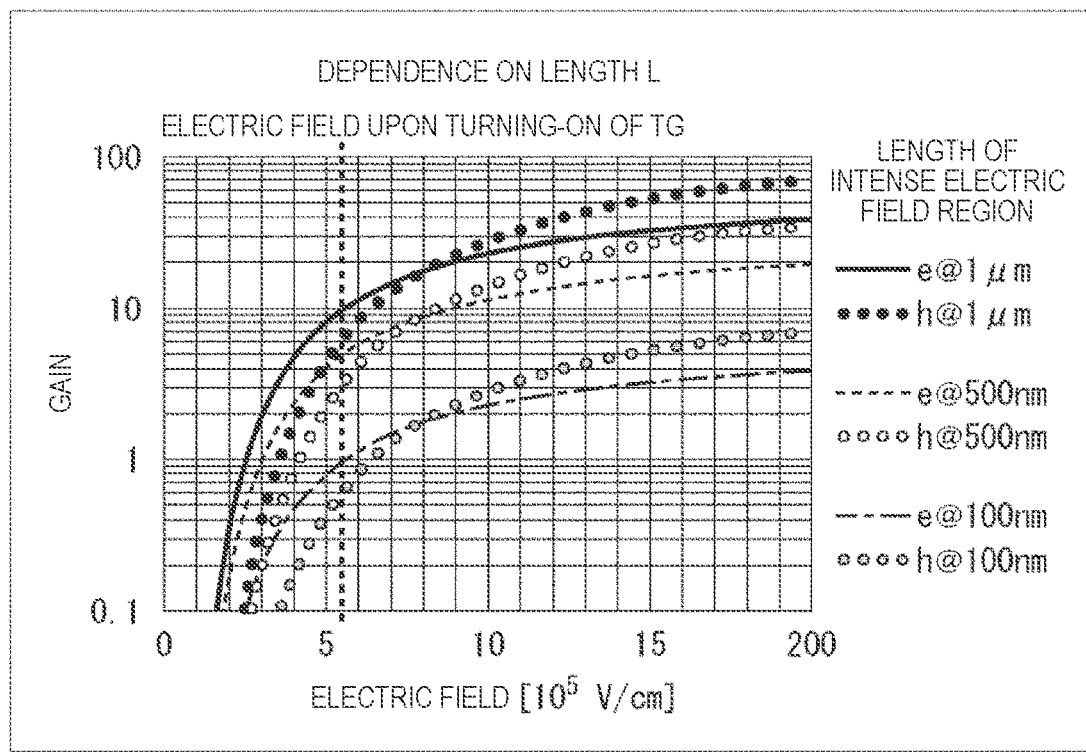
FIG. 30 is a diagram illustrated to describe the electric charge multiplication effect.

Then, if such collision ionization probability is converted using the avalanche probability formula shown in FIG. 29, it is possible to obtain an electric charge multiplication effect as shown in FIG. 30. In FIG. 30, the horizontal axis represents electric field, and the vertical axis represents gains in which the lengths to be the intense electric field region are set to 1 μm, 500 nm, and 100 nm on the basis of the electric charge with electrons (e) and holes (h).

In one example, as shown in FIG. 30, when the transfer signal TG supplied to the second transfer transistor 34 is turned on, an electric field of about 5 [$10^5$ V/cm] is generated. In this event, it shows that it is possible to obtain a multiplication effect of about 10 at the maximum (e.g., electric charge: electron (e), length to be an intense electric field region: 1 μm) by appropriately adjusting the distance at which the electric field is generated.

As shown in FIGS. 28 to 30, the generation of an appropriate intense electric field in the multiplication region 33 makes it possible to multiply the electric charge in transferring electric charge from the multiplication region 33 to the FD portion 35 by using the second transfer transistor 34 even if the structure similar to that of the CMOS image sensor in related art is employed.

Moreover, the image sensor 11 as described above is applicable to, in one example, various kinds of electronic apparatuses, such as an image capture system including a digital still camera, a digital video camera, and the like, a mobile telephone equipped with an imaging function, or other devices equipped with an imaging function.

<Configuration Example of Image Capture Device>

Figure 31:
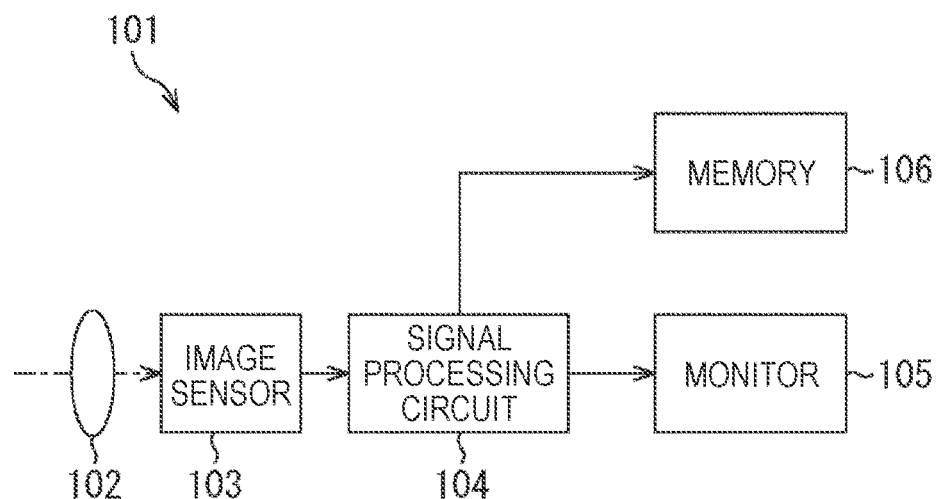
FIG. 31 is a block diagram illustrating a configuration example of an image capture device installed in an electronic apparatus.

FIG. 31 is a block diagram illustrating a configuration example of an image capture device installed in an electronic apparatus.

As illustrated in FIG. 31, the image capture device 101 includes an optical system 102, an image sensor 103, a signal processing circuit 104, a monitor 105, and a memory 106, and is able to capture still images and moving images.

The optical system 102 includes one or more lenses, and guides image light (incident light) from a photographic subject to the image sensor 103 to form an image on a light receiving face (sensor unit) of the image sensor 103.

The image sensor 11 described above is used as the image sensor 103. In the image sensor 103, electrons are stored for a fixed period of time depending on an image formed on the light receiving face through the optical system 102. Then a signal corresponding to the electrons stored in the image sensor 103 is supplied to the signal processing circuit 104.

The signal processing circuit 104 performs various signal processes on pixel signals output from the image sensor 103. An image (image data) obtained by the signal processing circuit 104 performing a signal process is supplied to the monitor 105 so to be displayed, or supplied to the memory 106 so as to be stored (recorded).

The image capture device 101 configured as described above uses the above-described image sensor 11, thereby, in one example, achieving sensitivity improvement and capturing an image with higher image quality.

<Usage Example of Image Sensor>

Figure 32:
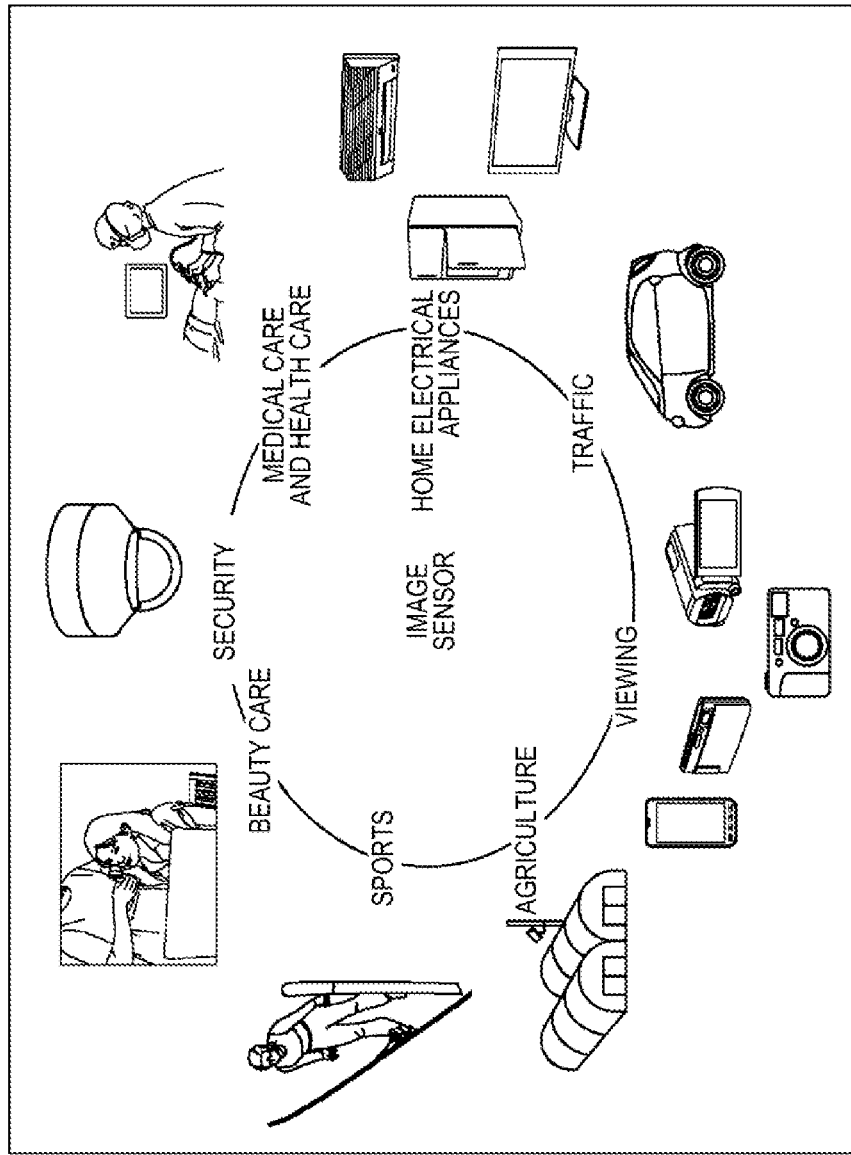
FIG. 32 is a diagram illustrating a usage example of using an image sensor.

FIG. 32 is a diagram illustrating a usage example of using the above-described image sensor 11 (image sensor).

The above-described image sensor can be, in one example, used in various cases of sensing light such as visible light, infrared light, ultraviolet light, and X-ray as described below.

Devices that captures an image used for viewing, such as a digital camera or a portable device equipped with camera function Devices used for traffic, which are used for safe driving (e.g., automatic stop), recognition of the condition of a driver, and the like, such as an in-vehicle sensor that captures an image of the front, back, surrounding, inside, and the like of the car, a monitoring camera that monitors travelling vehicles and roads, and a distance measuring sensor that measures an inter-vehicle distance and the like Devices used for home electrical appliances, such as a TV, a refrigerator, and an air conditioner, to capture an image of a user gesture and perform appliance operation in accordance with the gesture Devices used for medical care and health care, such as an endoscope and a device that performs angiography by reception of infrared light Devices used for security, such as a monitoring camera for crime prevention and a camera for personal authentication Devices used for beauty care, such as skin measurement equipment that captures images of the skin and a microscope that captures images of the scalp Devices used for sports, such as an action camera and a wearable camera for sports and the like Devices used for agriculture, such as a camera for monitoring the condition of the fields and crops Additionally, the present technology may also be configured as below.

(1)

A solid-state image sensor including:
a photoelectric conversion unit configured to convert light into electric charge by photoelectric conversion and to store the electric charge;
a read-out unit configured to read out the electric charge stored in the photoelectric conversion unit;
a multiplication region configured to store temporarily and multiply the electric charge read out through the read-out unit; and
a transfer unit configured to transfer the electric charge stored in the multiplication region to a conversion unit configured to convert the electric charge into a pixel signal.

(2)

The solid-state image sensor according to (1),
in which an intense electric field region is generated in the multiplication region to multiply the electric charge by an avalanche effect in transferring the electric charge from the multiplication region to the conversion unit through the transfer unit.

(3)

The solid-state image sensor according to (1) or (2),
in which an optional negative bias is applied to the read-out unit in transferring the electric charge from the multiplication region to the conversion unit through the transfer unit.

(4)

The solid-state image sensor according to any of (1) to (3),
in which the photoelectric conversion unit and the multiplication region are arranged to be stacked in a vertical direction of a semiconductor substrate, and
the read-out unit has a vertical transistor structure for reading out the electric charge in the vertical direction of the semiconductor substrate.

(5)

The solid-state image sensor according to (4),
in which the photoelectric conversion unit and the multiplication region are arranged to be stacked by forming the photoelectric conversion unit in the semiconductor substrate, and forming an epitaxial layer by performing crystal growth on the semiconductor substrate, then forming the multiplication region in the epitaxial layer.

(6)

The solid-state image sensor according to (4), in which the photoelectric conversion unit and the multiplication region are arranged to be stacked by separating a depth direction in performing ion implantation of impurities into the same semiconductor substrate.

(7)

The solid-state image sensor according to (4), in which the photoelectric conversion unit and the multiplication region are arranged to be stacked by bonding a first semiconductor substrate in which the photoelectric conversion portion is formed and a second semiconductor substrate in which the multiplication region is formed.

(8)

The solid-state image sensor according to any of (4) to (7), in which the transfer unit is arranged between the multiplication region and the conversion unit and has a vertical transistor structure for reading out the electric charge from the photoelectric conversion unit, and it is possible to switch a first driving method of reading out electric charge from the photoelectric conversion unit to the multiplication region through the read-out unit and a second driving method of reading out electric charge from the photoelectric conversion unit to the conversion unit through the transfer unit.

(9)

The solid-state image sensor according to any of (4) to (8), further including:

a light blocking film configured to block light from entering the multiplication region, between the photoelectric conversion unit and the multiplication region that are arranged to be stacked.

(10)

The solid-state image sensor according to any of (1) to (9), further including:

a light blocking portion configured to block light from entering the multiplication region from another adjacent pixel.

(11)

The solid-state image sensor according to any of (1) to (10), in which a plurality of electrodes to which optional bias voltages are applied in transferring electric charge from the multiplication region to the conversion unit are arranged on a front surface of a semiconductor substrate in which the multiplication region is formed.

(12)

The solid-state image sensor according to any of (1) to (11), in which the photoelectric conversion is performed only by the photoelectric conversion unit formed in a semiconductor substrate.

(13)

The solid-state image sensor according to any of (1) to (12), in which an organic film or an inorganic film sensitive to light having a predetermined wavelength component is stacked on a semiconductor substrate in which the photoelectric conversion unit is formed, the photoelectric conversion is performed in the organic film or the inorganic film, and the photoelectric conversion unit performs photoelectric conversion on light other than the specific wavelength component transmitted through the organic film or the inorganic film.

(14)

The solid-state image sensor according to any of (1) to (3), in which the photoelectric conversion unit and the multiplication region are arranged to in a same layer of a semiconductor substrate.

(15)

The solid-state image sensor according to any of (1) to (9), in which the solid-state image sensor has a pixel sharing structure in which a predetermined number of the photoelectric conversion units share a pixel circuit by using a transistor provided at a stage subsequent to the transfer unit.

(16)

A method of driving a solid-state image sensor including a photoelectric conversion unit configured to convert light into electric charge by photoelectric conversion and to store the electric charge;

a read-out unit configured to read out the electric charge stored in the photoelectric conversion unit, a multiplication region configured to store temporarily and multiply the electric charge read out through the read-out unit, and a transfer unit configured to transfer the electric charge stored in the multiplication region to a conversion unit configured to convert the electric charge into a pixel signal, the method including:

a step of generating an intense electric field region in the multiplication region to multiply electric charge by an avalanche effect in transferring the electric charge from the multiplication region to the conversion unit through the transfer unit.

(17)

An electronic apparatus including a solid-state image sensor including a photoelectric conversion unit configured to convert light into electric charge by photoelectric conversion and to store the electric charge, a read-out unit configured to read out the electric charge stored in the photoelectric conversion unit, a multiplication region configured to store temporarily and multiply the electric charge read out through the read-out unit, and a transfer unit configured to transfer the electric charge stored in the multiplication region to a conversion unit configured to convert the electric charge into a pixel signal.

Further, the embodiments of the present disclosure are not limited to the embodiments described above and various modifications can be made without departing from the gist of the present disclosure.

REFERENCE SIGNS LIST 11 image sensor
12 pixel region
13 vertical drive circuit
14 column signal processing circuit
15 horizontal drive circuit
16 output circuit
17 control circuit
21 pixel
22 horizontal signal line
23 vertical signal line 24 data output signal line
31 PD
32 first transfer transistor
33 multiplication region
34 second transfer transistor
35 FD portion
36 amplification transistor
37 selection transistor
38 reset transistor
39 constant current source
41 semiconductor substrate
42 color filter
43 on-chip lens
44, 45 gate electrode
46 light blocking portion
47 light blocking film
48, 49 multiplication gate electrode
50 organic film
51 inorganic film
52, 53 organic film
54 light blocking film

What is claimed is:

1. A solid-state image sensor comprising:
  a photoelectric conversion unit, wherein the photoelectric conversion unit converts light into electric charge by photoelectric conversion and stores the electric charge;
  a read-out unit, wherein the read-out unit reads out the electric charge stored in the photoelectric conversion unit;
  a multiplication region, wherein the multiplication region temporarily stores and multiplies the electric charge read out through the read-out unit; and
  a transfer unit, wherein the transfer unit transfers the electric charge stored in the multiplication region to a conversion unit, wherein the conversion unit converts the electric charge into a pixel signal, wherein the transfer unit is arranged between the multiplication region and the conversion unit and has a vertical transistor structure for reading out the electric charge from the photoelectric conversion unit,
  wherein it is possible to switch between a first driving method of reading out electric charge from the photoelectric conversion unit to the multiplication region through the read-out unit and a second driving method of reading out electric charge from the photoelectric conversion unit to the conversion unit through the transfer unit.

2. The solid-state image sensor according to claim 1, wherein an intense electric field region is generated in the multiplication region and multiplies the electric charge by an avalanche effect in transferring the electric charge from the multiplication region to the conversion unit through the transfer unit.

3. The solid-state image sensor according to claim 2, wherein an optional negative bias is applied to the read-out unit in transferring the electric charge from the multiplication region to the conversion unit through the transfer unit.

4. The solid-state image sensor according to claim 1, wherein the photoelectric conversion unit and the multiplication region are stacked in a vertical direction of a semiconductor substrate, and
  the read-out unit has a vertical transistor structure for reading out the electric charge in the vertical direction of the semiconductor substrate.

5. The solid-state image sensor according to claim 4, wherein the photoelectric conversion unit and the multiplication region are stacked by forming the photoelectric conversion unit in the semiconductor substrate, forming an epitaxial layer by performing crystal growth on the semiconductor substrate, and forming the multiplication region in the epitaxial layer.

6. The solid-state image sensor according to claim 4, wherein the photoelectric conversion unit and the multiplication region are stacked by separating a depth direction in performing ion implantation of impurities into the same semiconductor substrate.

7. The solid-state image sensor according to claim 4, wherein the photoelectric conversion unit and the multiplication region are stacked by bonding a first semiconductor substrate in which the photoelectric conversion unit is formed and a second semiconductor substrate in which the multiplication region is formed.

8. The solid-state image sensor according to claim 4, further comprising:
  a light blocking film between the photoelectric conversion unit and the multiplication region, wherein the light blocking film blocks light from entering the multiplication region.

9. The solid-state image sensor according to claim 1, further comprising:
  a light blocking portion, wherein the light blocking portion blocks light from entering the multiplication region from another adjacent pixel.

10. The solid-state image sensor according to claim 1, wherein a plurality of electrodes to which optional bias voltages are applied in transferring electric charge from the multiplication region to the conversion unit are arranged on a front surface of a semiconductor substrate in which the multiplication region is formed.

11. The solid-state image sensor according to claim 1, wherein the photoelectric conversion is performed only by the photoelectric conversion unit formed in a semiconductor substrate.

12. The solid-state image sensor according to claim 1, wherein an organic film or an inorganic film sensitive to light having a specific wavelength component is stacked on a semiconductor substrate in which the photoelectric conversion unit is formed, the photoelectric conversion is performed in the organic film or the inorganic film, and the photoelectric conversion unit performs photoelectric conversion on light other than the specific wavelength component transmitted through the organic film or the inorganic film.

13. The solid-state image sensor according to claim 1, wherein the photoelectric conversion unit and the multiplication region are arranged in a layer of a semiconductor substrate.

14. The solid-state image sensor according to claim 1, wherein the solid-state image sensor has a pixel sharing structure in which a predetermined number of the photoelectric conversion units share a pixel circuit by using a transistor provided at a stage subsequent to the transfer unit.

15. A method of driving a solid-state image sensor including
  a photoelectric conversion unit, wherein the photoelectric conversion unit converts light into electric charge by photoelectric conversion and stores the electric charge;
  a read-out unit, wherein the read-out unit reads out the electric charge stored in the photoelectric conversion unit,
  a multiplication region, wherein the multiplication region temporarily stores and multiplies the electric charge read out through the read-out unit, and a transfer unit, wherein the transfer unit transfers the electric charge stored in the multiplication region to a conversion unit, wherein the conversion unit converts the electric charge into a pixel signal, wherein the transfer unit is arranged between the multiplication region and the conversion unit and has a vertical transistor structure for reading out the electric charge from the photoelectric conversion unit, and the method comprising:

generating an intense electric field region in the multiplication region, wherein the electric charge is multiplied by an avalanche effect in transferring the electric charge from the multiplication region to the conversion unit through the transfer unit, wherein it is possible to switch between a first driving method of reading out electric charge from the photoelectric conversion unit to the multiplication region through the read-out unit and a second driving method of reading out electric charge from the photoelectric conversion unit to the conversion unit through the transfer unit.

16. An electronic apparatus comprising a solid-state image sensor including a photoelectric conversion unit, wherein the photoelectric conversion unit converts light into electric charge by photoelectric conversion and stores the electric charge, a read-out unit, wherein the read-out unit reads out the electric charge stored in the photoelectric conversion unit, a multiplication region, wherein the multiplication region temporarily stores and multiplies the electric charge read out through the read-out unit, and a transfer unit, wherein the transfer unit transfers the electric charge stored in the multiplication region to a conversion unit, wherein the conversion unit converts the electric charge into a pixel signal, wherein the transfer unit is arranged between the multiplication region and the conversion unit and has a vertical transistor structure for reading out the electric charge from the photoelectric conversion unit, and wherein it is possible to switch between a first driving method of reading out electric charge from the photoelectric conversion unit to the multiplication region through the read-out unit and a second driving method of reading out electric charge from the photoelectric conversion unit to the conversion unit through the transfer unit.

\* \* \* \* \*